United States Patent
Zhang et al.

(10) Patent No.: US 12,336,286 B2
(45) Date of Patent: Jun. 17, 2025

(54) DISPLAY PANEL COMPRISING DISPLAY REGION AND NARROW WIDTH NON-DISPLAY REGION AND MANUFACTURING METHOD THEREOF

(71) Applicant: YUNGU (GU' AN) TECHNOLOGY CO., LTD., Hebei (CN)

(72) Inventors: Xiuyu Zhang, Langfang (CN); Jinyan Huang, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 543 days.

(21) Appl. No.: 17/376,417

(22) Filed: Jul. 15, 2021

(65) Prior Publication Data

US 2021/0343758 A1    Nov. 4, 2021

Related U.S. Application Data

(63) Continuation of application No. PCT/CN2019/130732, filed on Dec. 31, 2019.

(30) Foreign Application Priority Data

| Jun. 28, 2019 | (CN) | 201910579037.7 |
| Jun. 28, 2019 | (CN) | 201910579056.X |
| Jun. 28, 2019 | (CN) | 201910580526.4 |

(51) Int. Cl.
   *H10D 86/40*    (2025.01)
   *H10D 86/01*    (2025.01)
   (Continued)

(52) U.S. Cl.
   CPC ....... *H10D 86/443* (2025.01); *H10D 86/0212* (2025.01); *H10D 86/411* (2025.01); *H10D 86/60* (2025.01); *H10K 59/82* (2023.02)

(58) Field of Classification Search
   None
   See application file for complete search history.

(56) References Cited

U.S. PATENT DOCUMENTS

| 2008/0030124 A1* | 2/2008 | Ryu | H01J 63/02 |
| | | | 313/496 |
| 2011/0194063 A1 | 8/2011 | Lee et al. | |

(Continued)

FOREIGN PATENT DOCUMENTS

| CN | 101118832 A | 2/2008 |
| CN | 102262313 A | 11/2011 |

(Continued)

OTHER PUBLICATIONS

International Search Report issued on Mar. 26, 2020 in corresponding International Application No. PCT/CN2019/130732; 5 pages.

(Continued)

*Primary Examiner* — Daniel Whalen
(74) *Attorney, Agent, or Firm* — Maier & Maier, PLLC

(57) ABSTRACT

A display panel and a manufacturing method thereof. The display panel has a display region and a non-display region located on at least one side of the display region and includes a first substrate. The first substrate has a first base located at a non-display region and a second base located at the display region, and the first base includes a first surface, a second surface perpendicular to the first surface, and at least one third surface connecting the first surface and the second surface. The second surface is inseparable from the first substrate. The display panel further includes multiple first connection portions disposed on the second surface and multiple first signal lines which trace through the first surface and the third surface. The multiple first connection portions are electrically connected to the multiple first signal lines correspondingly to transmit display signals.

7 Claims, 13 Drawing Sheets

(51) Int. Cl.
*H10D 86/60* (2025.01)
*H10K 59/82* (2023.01)

(56) References Cited

U.S. PATENT DOCUMENTS

| | | | |
|---|---|---|---|
| 2016/0118370 A1 | 4/2016 | Wu et al. | |
| 2020/0259056 A1* | 8/2020 | Hong | H01L 25/0753 |
| 2021/0135076 A1* | 5/2021 | Jung | H01L 25/167 |

FOREIGN PATENT DOCUMENTS

| | | | |
|---|---|---|---|
| CN | 103217845 A | 7/2013 | |
| CN | 106558600 A | 4/2017 | |
| CN | 107121854 A | 9/2017 | |
| CN | 107799050 A | 3/2018 | |
| CN | 108681119 A | 10/2018 | |
| CN | 108777114 A | 11/2018 | |
| CN | 109001943 A | 12/2018 | |
| CN | 109343249 A | 2/2019 | |
| CN | 109541834 A | 3/2019 | |
| CN | 109634356 A | 4/2019 | |
| CN | 110161740 A | 8/2019 | |
| CN | 110187580 A | 8/2019 | |
| CN | 110297347 A | 10/2019 | |
| JP | 2005242248 A | 9/2005 | |
| KR | 20070071341 A | 7/2007 | |

OTHER PUBLICATIONS

Search Report issued on Apr. 7, 2020 in corresponding Chinese Application No. 201910579037.7; 2 pages.
Supplemental Search Report issued on Sep. 1, 2020 in corresponding Chinese Application No. 201910579037.7; 1 page.
First Office Action issued on Apr. 13, 2020 in corresponding Chinese Application No. 201910579037.7; 16 pages; Machine translation attached.
Second Office Action issued on Sep. 8, 2020 in corresponding Chinese Application No. 201910579037.7; 17 pages; Machine translation attached.
Third Office Action issued on Mar. 24, 2021 in corresponding Chinese Application No. 201910579037.7; 13 pages; Machine translation attached.
Search Report issued on Apr. 28, 2020 in corresponding Chinese Application No. 201910579056.X; 2 pages.
Supplemental Search Report issued on Oct. 12, 2020 in corresponding Chinese Application No. 201910579056.X; 1 page.
First Office Action issued on May 8, 2020 in corresponding Chinese Application No. 201910579056.X; 17 pages; Machine translation attached.
Second Office Action issued on Oct. 19, 2020 in corresponding Chinese Application No. 201910579056.X; 15 pages; Machine translation attached.
Search Report issued on Apr. 8, 2020 in corresponding Chinese Application No. 201910580526.4; 2 pages.
First Office Action issued on Apr. 17, 2020 in corresponding Chinese Application No. 201910580526.4; 23 pages; Machine translation attached.
Second Office Action issued on Oct. 10, 2020 in corresponding Chinese Application No. 201910580526.4; 21 pages; Machine translation attached.

* cited by examiner

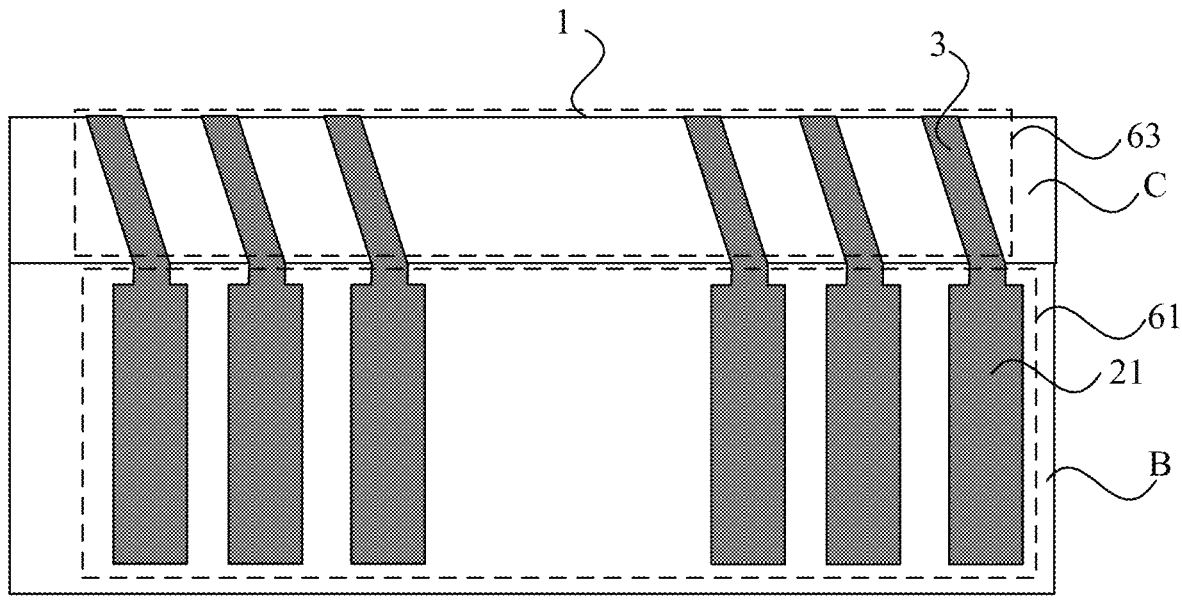

FIG. 3

| Form a first substrate, where the first substrate includes a third surface formed by a punching process | ⟋ S10 |

| Form a first patterned structure on the second surface of the first substrate, where the first patterned structure at least includes multiple first connection portions, and the multiple first connection portions are electrically connected to multiple first signal lines respectively and transmit display signals through the multiple first signal lines | ⟋ S11 |

FIG. 4

DISPLAY PANEL COMPRISING DISPLAY REGION AND NARROW WIDTH NON-DISPLAY REGION AND MANUFACTURING METHOD THEREOF

CROSS-REFERENCE TO RELATED APPLICATIONS

This is a continuation of International Patent Application No. PCT/CN2019/130732, filed on Dec. 31, 2019, which claims priority to Chinese Patent Application No. 201910579037.7, filed on Jun. 28, 2019, Chinese Patent Application No. 201910580526.4, filed on Jun. 28, 2019, and Chinese Patent Application No. 201910579056.X, filed on Jun. 28, 2019, the disclosures of all of which are incorporated herein by reference in their entireties.

FIELD

Embodiments of the present application relate to the field of display technologies and, for example, to a display panel and a manufacturing method thereof.

BACKGROUND

As a full-screen technology develops, the market demand for narrow-bezel products is increasing, and reducing the size of a bezel is an effective means to increase the screen-to-body ratio of a display screen.

The Chip On Flex (COF) bending technology is to bend the COF to the back of the screen body. However, the lower bezel of a display panel is still affected by a binding region. For a flexible display panel, the binding region may be bent to the back of the screen body to reduce the width of the lower bezel of the display panel; however, the binding region bending technology about a flexible screen cannot be applied to a hard screen, resulting in a larger width of the lower bezel of the hard screen, and thus it is not beneficial to the implementation of the narrow bezel of the display panel.

SUMMARY

The present application provides a display panel and a manufacturing method thereof, which is beneficial to the implementation of a narrow bezel of a hard screen and reducing the probability of a signal line being broken.

In a first aspect, a display panel having a display region and a non-display region located on at least one side of the display region is provided in an embodiment of the present application and includes a first substrate, and a plurality of first connection portions.

The first substrate has a first base located at the non-display region and a second base located at the display region, where the first base includes a first surface, a second surface perpendicular to the first surface, and at least one third surface connecting the first surface and the second surface; the second surface is inseparable from the first substrate, and the first surface and the second surface extend along two different directions; where in a direction perpendicular to the first surface, a thickness of the first base on the second surface is less than a thickness of the first base on the first surface.

The plurality of first connection portions is disposed on the second surface and electrically connected to a plurality of first signal lines to transmit display signals through the plurality of first signal lines.

The plurality of first signal lines traces through the first surface and the at least one third surface.

In a second aspect, a method for manufacturing a display panel is further provided in an embodiment of the present application. The manufacturing method includes: forming a first substrate, defining a first surface, a second surface perpendicular to the first surface, and at least one third surface connecting the first surface and the second surface, making a thickness of a first base of the first substrate on the second surface in a direction perpendicular to the first surface is less than a thickness of the first base on the first surface in the direction perpendicular to the first surface; and forming, on the second surface of the first substrate, a first patterned structure having a plurality of first connection portions electrically connected to a plurality of first signal lines to transmit display signals.

The embodiments of the present application provide a display panel and a manufacturing method thereof. The display panel having a display region and a non-display region located on at least one side of the display region includes a first substrate. The first substrate has a first base located at the non-display region and a second base located at the display region, and the first base includes a first surface, a second surface perpendicular to the first surface, and at least one third surface connecting the first surface and the second surface. The second surface is inseparable from the first substrate, and the first surface and the second surface extend along two different directions; and in a direction perpendicular to the first surface, a thickness of the first base on the second surface is less than a thickness of the first base on the first surface. The display panel further includes a plurality of connection portions disposed on the second surface and a plurality of first signal lines tracing through the first surface and the third surface. The plurality of first connection portions is electrically connected to the plurality of first signal lines to transmit display signals. The width of the non-display region of the display panel is greatly reduced, which is beneficial to the implementation of a narrow bezel of a hard screen. At the same time, the probability of the signal line being broken is reduced.

BRIEF DESCRIPTION OF DRAWINGS

FIG. 3 is a schematic side view of a display panel according to an embodiment of the present application.

FIG. 4 is a flowchart illustrating a method for manufacturing a display panel according to an embodiment of the present application.

DETAILED DESCRIPTION

Figure 1:
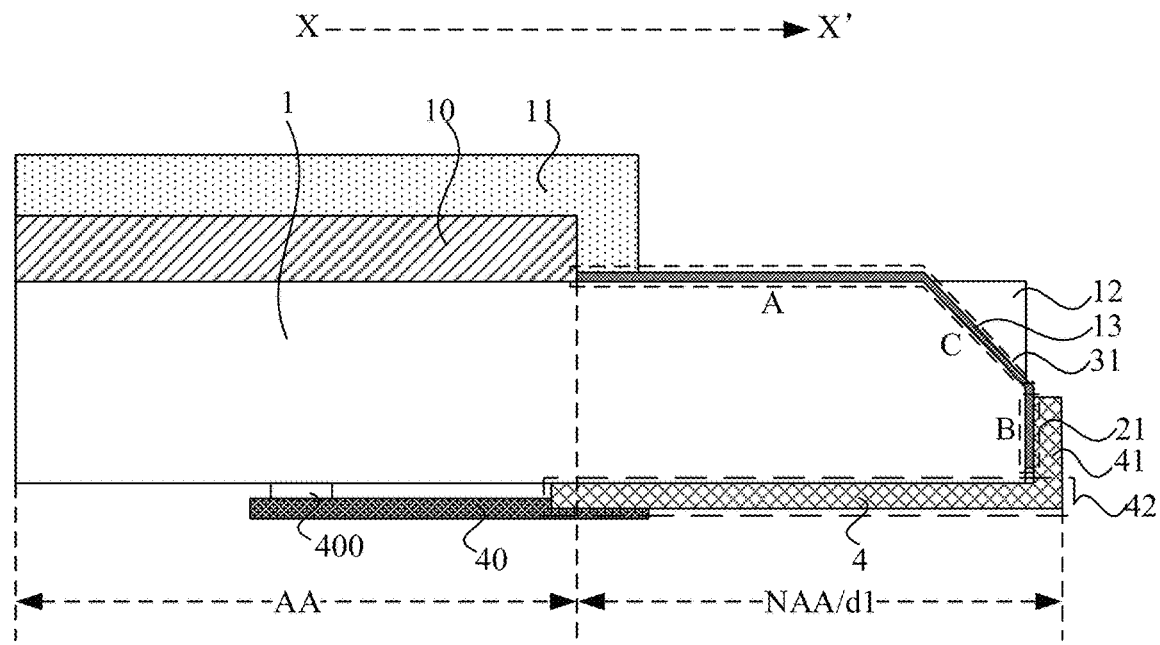
FIG. 1 is a schematic sectional view of a display panel according to an embodiment of the present disclosure.

A display panel having a display region and a non-display region located on at least one side of the display region is provided in an embodiment of the present application. The first substrate corresponds to the display region and the non-display region. The first substrate has a first base located at the non-display region includes a first surface and a second surface perpendicular to the first surface. The second surface is inseparable from the first substrate, and the first surface and the second surface extend along two different directions; and in a direction perpendicular to the first surface, a thickness of the first base on the second surface is less than a thickness of the first base on the first surface. The first substrate further includes a third surface connecting the first surface and the second surface. The display panel further includes multiple first connection portions disposed on the second surface. Multiple first signal lines satisfy one of the following: tracing through the first surface and the third surface then tracing into the second surface; or tracing through the first surface and the third surface. The multiple first connection portions are electrically connected to multiple corresponding first signal lines and transmit display signals through the multiple first signal lines. According to the display panel provided in the embodiment of the present application, the width of the non-display region of the display panel is greatly reduced, which is beneficial to the implementation of a narrow bezel of a hard screen. At the same time, the probability of the signal line being broken is reduced.

The COF bending technology is to bend the COF to the back of a screen body so as to reduce the width of the lower bezel of a display panel. However, the lower bezel of the display panel is still affected by a binding region and thus fails to be reduced in width. For a flexible display panel, the binding region may be bent to the back of the screen body to reduce the width of the lower bezel of the display panel; however, the binding region bending technology about a flexible screen cannot be applied to a hard screen which is limited by factors such as the glass elasticity modulus. This results in a larger width of the lower bezel of the hard screen, which is not beneficial to the implementation of the narrow bezel of the display panel.

A side binding technology is adopted in the embodiment of the present application. That is, the first connection portions are disposed on the second surface of the first substrate to greatly reduce the width of the non-display region of the display panel (i.e. the length of the non-display region in the direction from the display region towards the non-display region), which is beneficial to the implementation of the narrow bezel of the hard screen. In addition, the third surface is disposed and connects the first surface and the second surface, such that the first signal lines electrically connected to the first connection portions trace through the inclined third surface connecting the first surface and the second surface. The first signal line on the third surface formed during manufacturing the first signal lines on the first surface may be incomplete. The third surface is an inclined surface, which is beneficial to repairing the first signal line on the third surface during manufacturing the first connection portions on the second surface so as to form a complete structure of the first signal line on the third surface, reducing the probability of the first signal line on the third surface being broken, and further reducing the probability of the first signal line being broken. Moreover, the third surface is disposed so that the transition from the second surface of the first substrate to the first surface of the first substrate is closer to an arc transition, reducing the probability of the first signal line being broken.

Figure 2:
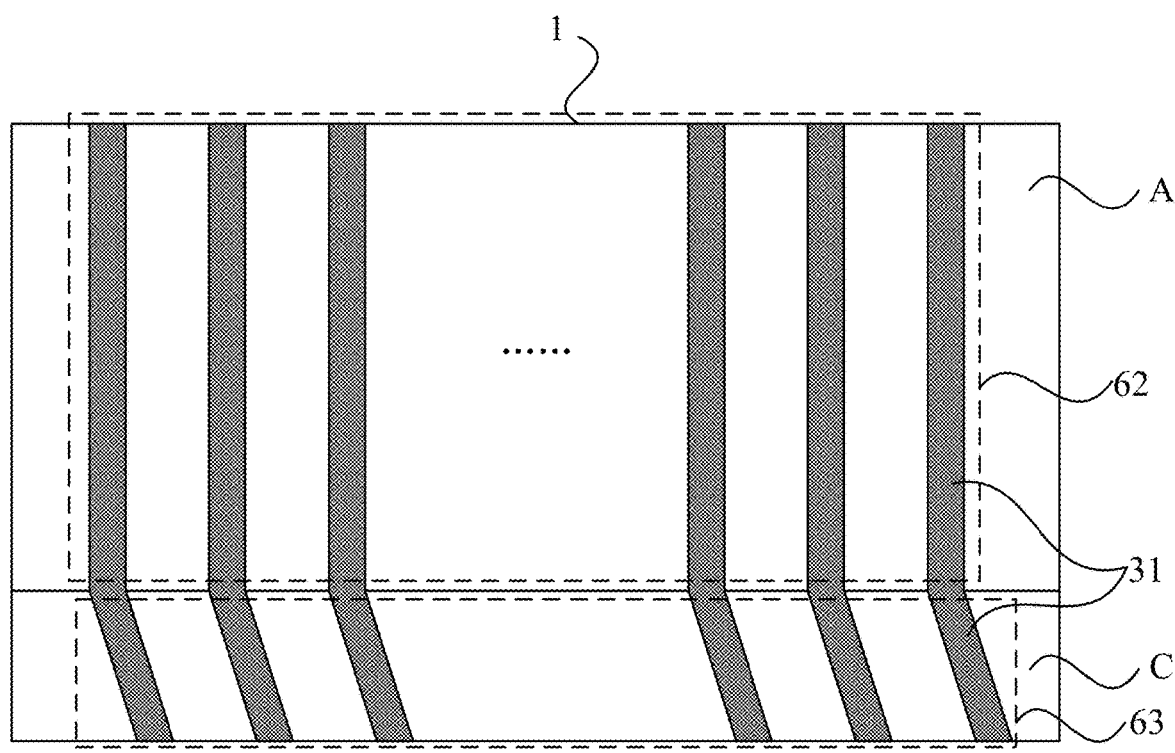
FIG. 2 is a schematic top view of a display panel according to an embodiment of the present application.

FIG. 1 is a schematic sectional view of a display panel according to an embodiment of the present disclosure; FIG. 2 is a schematic top view of a display panel according to an embodiment of the present application; and FIG. 3 is a schematic side view of a display panel according to an embodiment of the present application. In conjunction with FIGS. 1 to 3, a display panel includes a display region AA and a non-display region NAA located on at least one side of the display region AA. Merely the non-display region NAA located on one side of the display region AA is shown here and may correspond to the lower bezel of the display panel.

The display panel further includes a first substrate 1. The first substrate 1 corresponds to the display region AA and the non-display region NAA. The first substrate 1 has a first base located at the non-display region NAA and a second base located at the display region, and the first base includes a first surface A (i.e., the upper surface of the first substrate 1) and a second surface B (i.e., a side surface of the first substrate 1) perpendicular to the first surface A. The second surface B is inseparable from the first substrate 1 (i.e., the second surface B is the side of the first substrate 1 not in contact with the display region AA). The thickness of the first base on the second surface B in the direction perpendicular to the first surface A is less than the thickness of the first base on the first surface A in the direction perpendicular to the first surface A. That is, the thickness of the first substrate 1 corresponding to the second surface B in the direction perpendicular to the first surface A is less than the thickness of the first substrate 1 corresponding to the first surface A in the direction perpendicular to the first surface A. That is, in the direction perpendicular to the first surface A of the first substrate 1, the thickness of the first substrate 1 corresponding to the second surface B is less than the thickness of the first substrate 1 corresponding to the first surface A.

The first substrate 1 further includes a third surface C connecting the first surface A and the second surface B. It is to be noted that the display panel does not include a portion 12 shown in FIG. 1 after manufacturing. The portion 12 being shown in FIG. 1 is merely used as one implementation mode to embody the third surface C, that is, the third surface C is formed by a punching process. Since the second surface B is located on the side of the first substrate 1 spaced from the display region AA and the thickness of the first base on the second surface B in the direction perpendicular to the first surface A is less than the thickness of the first base on the first surface A in the direction perpendicular to the first surface A, the third surface C is formed into an inclined surface as shown in FIG. 1. The display panel further includes multiple first connection portions 21 disposed on the second surface B. Multiple first signal lines 31 satisfy one of the following: tracing through the first surface A and the third surface C then tracing into the second surface B; or tracing through the first surface A and the third surface C. The multiple first connection portions 21 are electrically connected to multiple corresponding first signal lines 31 and transmit display signals through the multiple corresponding first signal lines 31.

Exemplarily, in conjunction with FIGS. 1 to 3, the first substrate 1 may be a glass substrate. The display panel to be an organic light-emitting display panel is used as an example. The portion of the first substrate 1 corresponding to the display region AA is provided with structures such as an organic light-emitting display device 10 and a thin-film encapsulation layer 11. The second surface B of the first substrate 1 is provided with multiple first connection portions 21. A driver chip (not shown) transmits display signals through the multiple first connection portions 21 and the multiple first signal lines 31 disposed in one-to-one correspondence with the multiple first connection portions 21. For example, a data signal may be transmitted to the display region AA of the display panel or a clock signal may be transmitted to the non-display region NAA of the display panel.

In conjunction with FIGS. 1 to 3, the first connection portions 21 for implementing binding with the driver chip are all located on the second surface B of the first substrate 1 and the first connection portions 21 transmit the display signals through the multiple first signal lines 31 which trace through the third surface C and the first surface A, so that electrical connection relationships of the first connection portions 21 are implemented to transmit the display signals, and at the same time, the width of the non-display region NAA of the display panel in the direction XX' from the display region AA towards the non-display region NAA is greatly reduced by adopting a side binding technology. That is, the magnitude of dl in FIG. 1 is greatly reduced, which is beneficial to the implementation of a narrow bezel of a hard screen. In addition, the first substrate 1 includes the third surface C and the third surface C connects the first surface A and the second surface B, that is, the first substrate 1 includes the third surface C and the first signal lines 31 electrically connected to the first connection portions 21 trace through the third surface C. The first signal line 31 on the third surface C formed during manufacturing the first signal lines 31 on the first surface A may be incomplete. Since the third surface C is an inclined surface, it is beneficial to repairing the first signal line 31 on the third surface C during manufacturing the first connection portions 21 on the second surface B, thus greatly reducing the probability of the first signal line 31 on the third surface C being broken, and further reducing the probability of the first signal line 31 being broken when the display panel is used.

The included angle between the third surface C and the first surface A is greater than 0° and less than 90°; the included angle between the third surface C and the second surface B is greater than 0° and less than 90°. The third surface C formed by a punching process makes the transition from the second surface B of the first substrate 1 to the first surface A of the first substrate 1 closer to an arc transition, thus reducing the probability of the first signal line 31 being broken. Exemplarily, the included angle between the third surface C and the first surface A is greater than or equal to 30° and less than 60°, and the included angle between the third surface C and the second surface B is greater than or equal to 30° and less than 60°. The multiple first connection portions 21 are disposed on the second surface B of the first substrate 1 and the first signal lines 31 for transmitting the display signals and electrically connected to the first connection portions 21 trace through the third surface C. Therefore, the transition from the second surface B of the first substrate 1 to the first surface A of the first substrate 1 is closer to the arc transition, and the bending angle of the first substrate 1 from the second surface B to the third surface C and bending angle of the first substrate 1 from the third surface C to the first surface A uniformly change, thus avoiding abrupt changes in the bending angle of the first substrate 1 from the second surface B to the third surface C and the bending angle of the first substrate 1 from the third surface C to the first surface A. Therefore, the probability of the first signal line 31 being broken is reduced, and the impact of the first signal line 31 being broken on the display effect of the display panel is reduced.

In an embodiment, in conjunction with FIGS. 1 to 3, the ratio of the thickness of the first base on the second surface B in the direction perpendicular to the first surface A to the thickness of the portion of the first base on the first surface A in the direction perpendicular to the first surface A may be configured to be greater than or equal to 1:10 and less than 1:1. In conjunction with FIGS. 1 to 3, too small a thickness of the first base on the second surface B in the direction perpendicular to the first surface A does not facilitate the formation of the first connection portions 21 on the second surface B; too large a thickness of the first base on the second surface B in the direction perpendicular to the first surface A makes the portion 12 small, increasing the process difficulty of forming the third surface C of the first substrate 1 by punching. The ratio of the thickness of the first base on the second surface B in the direction perpendicular to the first surface A to the thickness of the first base on the first surface A in the direction perpendicular to the first surface A is configured to be greater than or equal to 1:10 and less than 1:1, so that the formation of the first connection portions 21 on the second surface B is facilitated and the difficulty of forming the third surface C of the first substrate 1 by punching is reduced.

In conjunction with FIGS. 1 to 3, the display panel may further include a flexible circuit board 4 including a first portion 41 and a second portion 42. The first portion 41 of the flexible circuit board 4 is parallel to the second surface B and is provided with multiple first pads (not shown), and the multiple first pads are electrically connected to the multiple first connection portions 21 on the second surface B of the first substrate 1 respectively. The second portion 42 is parallel to the first surface A, and the second portion 42 of the flexible circuit board 4 is bent from one end of the first portion 41 to the surface of the first substrate 1 opposite the first surface A. Exemplarily, the flexible circuit board 4 may be provided with a driver chip that transmits the display signals to the first connection portions 21 disposed on the second surface B of the first substrate 1 through the flexible circuit board 4 and the multiple first pads in the first portion 41 of the flexible circuit board 4, thereby implementing the transmission of the display signals to the display panel. The driver chip may be disposed in the second portion 42 of the flexible circuit board 4. The second portion 42 of the flexible circuit board 4 is bent from one end of the first portion 41 to the surface of the first substrate 1 opposite the first surface A, so that the driver chip is also bent to the surface of the first substrate 1 opposite the first surface A, that is, to the lower surface of the first substrate 1. Therefore, the width of the non-display region NAA of the display panel (that is, the length of the non-display region NAA in the direction from the display region AA towards the non-display region NAA) is reduced, which is beneficial to the implementation of the narrow bezel of the hard screen. In addition, the display panel may also include a first flexible circuit board 40, the flexible circuit board 4 may be electrically connected to the first flexible circuit board 40, and the first flexible circuit board is secured to the lower surface of the first substrate 1 through a securing structure 400.

A method for manufacturing a display panel is further provided in an embodiment of the present application. FIG. 4 is a flowchart illustrating a method for manufacturing a display panel according to an embodiment of the present application. The manufacturing method is used for manufacturing the display panel described in the preceding embodiment. As shown in FIG. 4, the method for manufacturing the display panel includes steps S10 to S11.

In step S10, a first substrate is formed, where the first substrate includes a third surface formed by a punching process.

Figure 5:
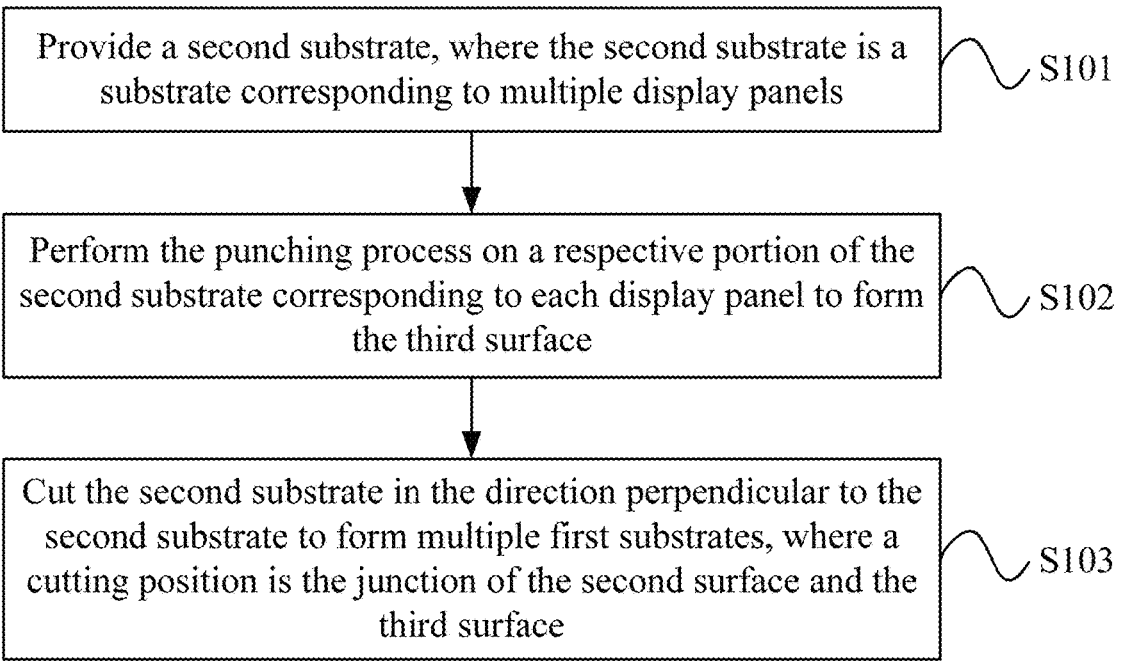
FIG. 5 is a flowchart illustrating a method for manufacturing a first substrate according to an embodiment of the present application.

In conjunction with FIGS. 1 to 3, the first substrate 1 is formed and the punching process may be performed on the first substrate 1 to form a third surface C. A connection hole 13 is formed by punching the first substrate 1 and exposes the third surface C of the first substrate 1. FIG. 5 is a flowchart illustrating a method for manufacturing a first substrate according to an embodiment of the present application. As shown in FIG. 5, the step in which the first substrate is formed includes steps S101 to S103.

In step S101, a second substrate is provided, where the second substrate is a substrate corresponding to multiple display panels.

Figure 6:
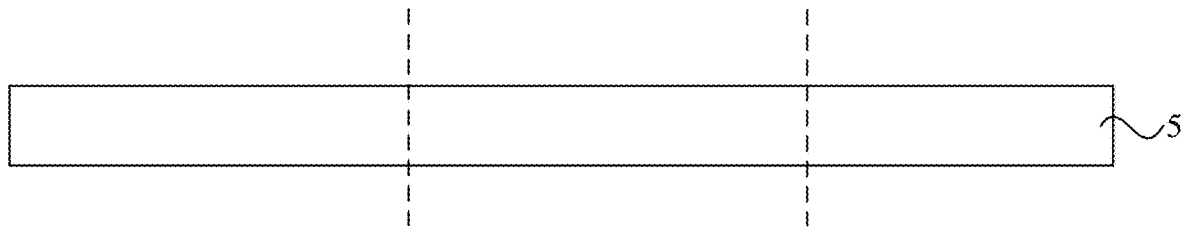
FIG. 6 is a schematic sectional view corresponding to a step of the manufacturing method shown in FIG. 5.

Exemplarily, as shown in FIG. 6, a second substrate 5 is provided and is a substrate corresponding to multiple display panels, and the multiple display panels are separated by two dotted lines of the second substrate 5 shown in FIG. 6.

In step S102, the punching process is performed on a respective portion of the second substrate corresponding to each display panel to form the third surface.

Figure 7:
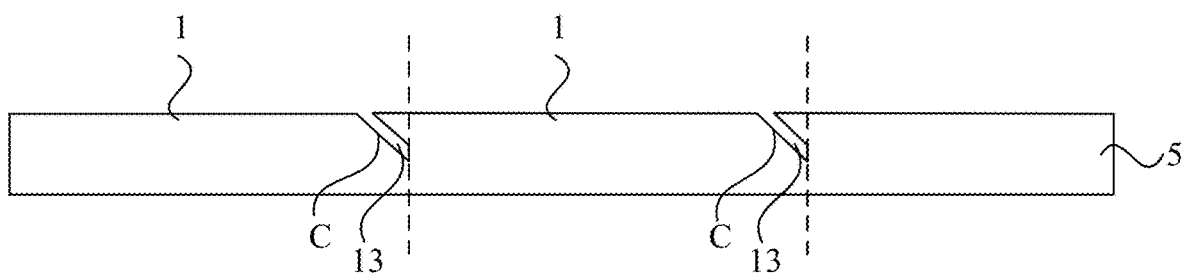
FIG. 7 is a schematic sectional view corresponding to a step of the manufacturing method shown in FIG. 5.

Exemplarily, as shown in FIG. 7, the punching process is performed on a respective portion of the second substrate 5 corresponding to each display panel to form the third surface C, and then the display panel may be used as a processing unit and the punching process is performed at the corresponding position of the second substrate 5 to form the hole in the shape shown in FIG. 7, and the inclined surface formed by punching is the third surface C corresponding to the first substrate 1.

In conjunction with FIGS. 1 to 7, the step in which the punching process is performed on the respective portion of the second substrate 5 corresponding to each display panel to form the third surface C includes the following step: the second substrate 5 is punched to form connection holes 13 corresponding to display panels, each display panel includes one connection hole 13 exposing the third surface C of the first substrate 1 of the corresponding display panel, and the first signal lines 31 trace through the connection hole 13.

In step S103, the second substrate is cut in a direction perpendicular to the second substrate to form multiple first substrates, where a cutting position is the junction of the second surface and the third surface.

Figure 8:
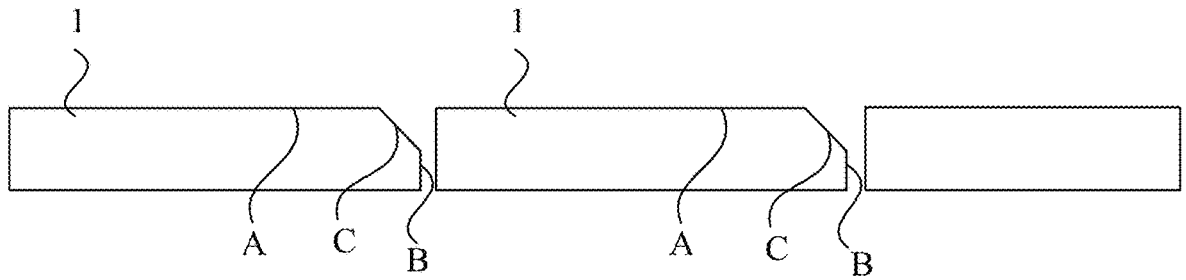
FIG. 8 is a schematic sectional view corresponding to a step of the manufacturing method shown in FIG. 5.

Exemplarily, as shown in FIG. 8, the second substrate 5 is cut in the direction perpendicular to the second substrate 5 to form multiple first substrates 1, and a cutting position is the junction of the second surface B and the third surface C. The second substrate 5 is cut at the positions of the dotted lines in FIG. 7 to form the multiple first substrates 1 shown in FIG. 8. The cut first substrate 1 has a first surface A (i.e., the upper surface of the first substrate 1), a second surface B perpendicular to the first surface A, and a third surface C connecting the first surface A and the second surface B.

In the formed display panel, the thickness of the first base on the second surface B in the direction perpendicular to the first surface A of the first substrate 1 is less than the thickness of the first base on the first surface A in the direction perpendicular to the first surface A of the first substrate 1. That is, the thickness of the first substrate 1 corresponding to the second surface B is less than the thickness of the first substrate 1 corresponding to the first surface A. Then the inclined connection hole 13 formed by punching penetrates the upper right corner of the first substrate 1 so that a portion 12 of the first substrate 1 is removed after the first substrate 1 is formed by cutting and the third surface C of the first substrate 1 is exposed to facilitate the manufacturing of the first signal lines 31 on the third surface C.

Before the second substrate is cut in the direction perpendicular to the second substrate to form the multiple first substrates, the manufacturing method may further include the following steps: a second patterned structure is formed on the first surface A of a respective portion of the second substrate corresponding to each display panel and a full-surface structure is formed in the connection hole, where the second patterned structure is composed of portions of the first signal lines on the first surface.

Exemplarily, in conjunction with FIGS. 1, 2 and 7, before the second substrate 5 is cut in the direction perpendicular to the second substrate 5 to form the multiple first substrates 1, the punching process has been performed on a respective portion of the second substrate 5 corresponding to each display panel to form the third surface C of the first substrate 1, such that a second patterned structure 62 may be formed on the first surface A of a respective portion of the second substrate 5 corresponding to each display panel, and a full-surface structure may be formed in the connection hole 13. The second patterned structure is composed of portions of the first signal lines 31 located on the first surface A. The connection hole 13 corresponding to the respective portion of the second substrate 5 corresponding to each display panel is a through hole. Then, during manufacturing the portions of the first signal lines 31 located on the first surface A, the materials of the first signal lines 31 flow into the connection hole 13 and form, in the connection hole 13, the full-surface structure having the same shape as the connection hole 13. The second patterned structure 62 and the full-surface structure are manufactured before the second substrate 5 is cut to form the first substrates 1.

In step S11, a first patterned structure 61 is formed on the second surface of the first substrate, where the first patterned structure at least includes multiple first connection portions 21, and the multiple first connection portions 21 are electrically connected to multiple first signal lines 31 respectively and transmit display signals through the multiple first signal lines 31.

Exemplarily, in conjunction with FIGS. 1, 3 and 8, after the second substrate 5 is cut to form the first substrates 1, the second surface B of the first substrate 1 is exposed, and the first patterned structure 61 is formed on the second surface B of the first substrate 1, where the first patterned structure 61 at least includes the multiple first connection portions 21. The first patterned structure 61 may include merely the multiple first connection portions 21; at this time the multiple first signal lines 31 trace merely through the first surface A and the third surface C. Alternatively, the first patterned structure may include not only the multiple first connection portions 21 but also the portions of the multiple first signal lines 31 located on the second surface and electrically connected to the multiple first connection portions 21 respectively; at this time, the multiple first signal lines 31 trace through the first surface A and the third surface C then trace into the second surface B.

In conjunction with FIGS. 1 to 3 and FIGS. 7 and 8, during forming the first patterned structure 61 on the second surface B of the first substrate 1, a third patterned structure 63 may be formed on the third surface C of the first substrate 1, and the third patterned structure 63 is composed of the portions of the first signal lines 31 located on the third surface C. The step in which the third patterned structure 63 is formed on the third surface C of the first substrate 1 includes a step described below.

A repair structure is formed on at least part of the third surface C of the first substrate 1, the repair structure on the third surface C is etched to form a repair line, and the full-surface structure on the third surface C is etched to form a fourth patterned structure, where the third patterned structure 63 is composed of the repair line and the fourth patterned structure.

Exemplarily, before the second substrate 5 is cut to form the first substrates 1, the full-surface structure is formed on the third surface C of the respective portion of the second substrate 5 corresponding to each display panel, that is, formed in the connection hole 13, which may results in that the formed full-surface structure may not completely fill the connection hole 13. Therefore, when the full-surface structure is etched to form the first signal lines 31 on the third surface C, the complete first signal lines 31 shown in FIG. 2 cannot be formed on the third surface C, resulting in an open circuit of the first signal line 31 electrically connected to the first connection portion 21, and thereby affecting the normal display effect of the display panel.

After the second substrate 5 is cut to form the multiple first substrates 1, the second surface B of the first substrate 1 is exposed. The third surface C is formed by the punching, so that during manufacturing the first patterned structure 61 on the second surface B, the incomplete first signal lines 31 on the third surface C may be repaired. For example, a repair structure is first formed at a position where the third surface C of the first substrate 1 is not covered by the full-surface structure. The repair structure may also be a full-surface repair structure, and then the third surface C is covered by the full-surface structure formed before the second substrate 5 is cut and the full-surface repair structure formed after the second substrate 5 is cut. The full-surface structure formed before the second substrate 5 is cut and the full-surface repair structure formed after the second substrate 5 is cut are etched to form a fourth patterned structure and a repair line respectively. Thus, the portions of the first signal lines 31 on the third surface C are formed, that is, the third patterned structure 63 is formed, ensuring the completeness of the first signal lines 31 formed on the third surface C (as shown in FIG. 2). Therefore, the breakage probability of the first signal line 31 electrically connected to the first connection portion 21 is greatly reduced, and the impact of the breakage of the first signal line 31 on the display effect of the display panel is further reduced.

Figure 9:
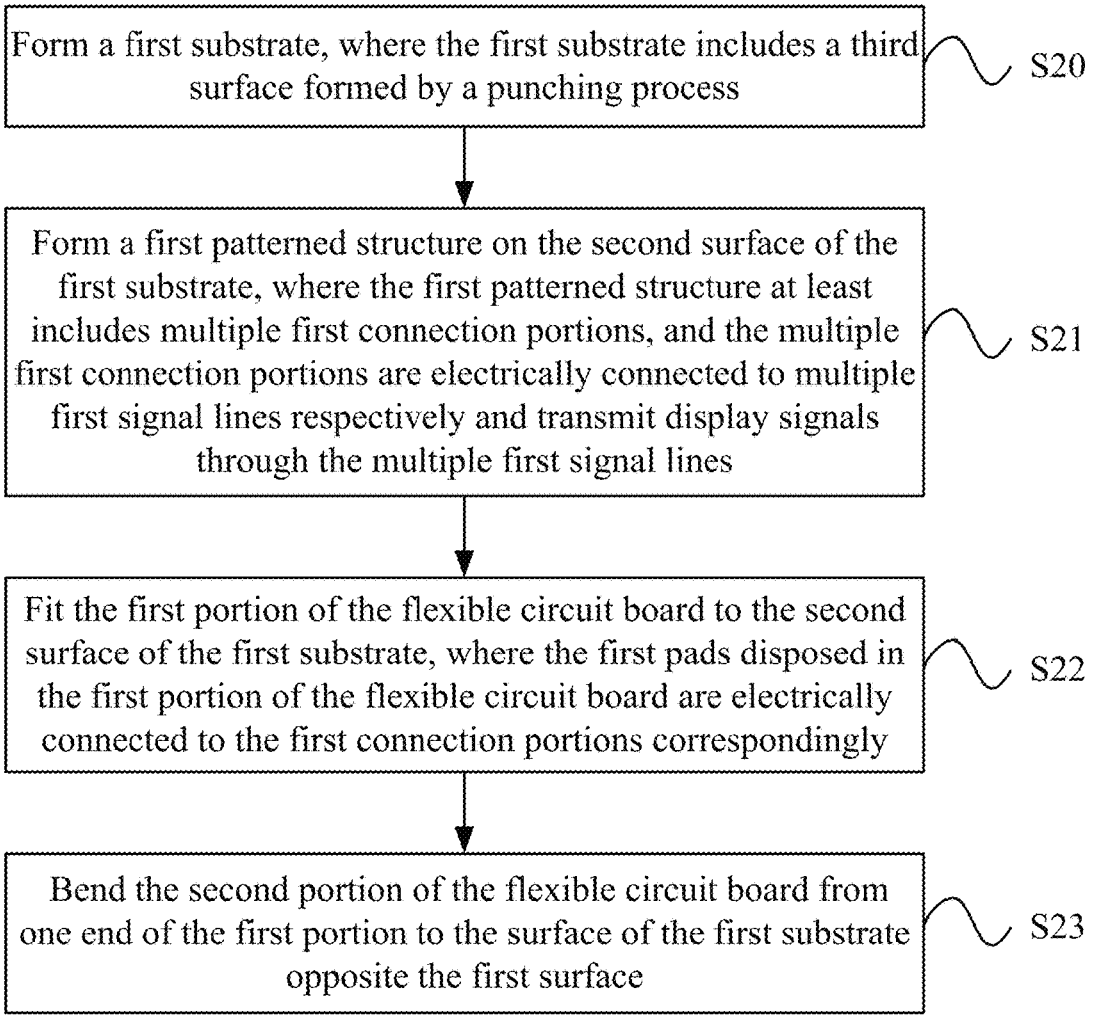
FIG. 9 is a flowchart illustrating another method for manufacturing a display panel according to an embodiment of the present application.

FIG. 9 is a flowchart illustrating a method for manufacturing another display panel according to an embodiment of the present application. Based on the method for manufacturing a display panel shown in FIG. 4, after the first patterned structure is formed on the second surface of the first substrate, the manufacturing method further includes the following steps: the first portion of the flexible circuit board is fitted to the second surface of the first substrate, where the first pads disposed in the first portion of the flexible circuit board are electrically connected to the first connection portions on the second surface correspondingly; and the second portion of the flexible circuit board is bent from one end of the first portion to the surface of the first substrate opposite the first surface. The first portion is parallel to the second surface and the second portion is parallel to the first surface. As shown in FIG. 9, the manufacturing method includes steps S20 to S23.

In step S20, a first substrate is formed, where a third surface of the first substrate is formed by a punching process.

In step S21, a first patterned structure is formed on the second surface of the first substrate, where the first patterned structure at least includes multiple first connection portions, and the multiple first connection portions are electrically connected to multiple first signal lines respectively and transmit display signals through the multiple first signal lines.

In step S22, the first portion of the flexible circuit board is fitted to the second surface of the first substrate, where the first pads disposed in the first portion of the flexible circuit board are electrically connected to the first connection portions correspondingly.

Exemplarily, in conjunction with FIGS. 1 to 3, the display panel may further include a flexible circuit board 4. A first portion 41 of the flexible circuit board 4 is provided with multiple first pads and is fitted to the second surface B of the first substrate 1. That is, the first pads disposed in the first portion 41 of the flexible circuit board 4 are electrically connected to the first connection portions 21 correspondingly. The flexible circuit board 4 may be provided with a driver chip that transmits display signals to the first connection portions 21 disposed on the second surface B of the first substrate 1 through the flexible circuit board 4 and the multiple first pads disposed in the first portion 41 of the flexible circuit board 4, thereby implementing the transmission of the display signals to the display panel.

In step S23, the second portion of the flexible circuit board is bent from one end of the first portion to the surface of the first substrate opposite the first surface.

Exemplarily, in conjunction with FIGS. 1 to 3, the driver chip may be disposed in the second portion 42 of the flexible circuit board 4. The second portion 42 of the flexible circuit board 4 is bent from one end of the first portion 41 to the surface of the first substrate 1 opposite the first surface A, so that the driver chip is also bent to the surface of the first substrate 1 opposite the first surface A, that is, to the lower surface of the first substrate 1. Therefore, the width of the non-display region NAA of the display panel in the direction XX' from the display region AA towards the non-display region NAA is reduced, which is beneficial to the implementation of the narrow bezel of the hard screen.

According to the method for manufacturing a display panel in the embodiment of the present application, the side binding technology is implemented for the display panel, greatly reducing the width of the non-display region NAA of the display panel in the direction XX' from the display region AA towards the non-display region NAA, which is beneficial to the implementation of the narrow bezel of the hard screen. In addition, the third surface C formed by punching is beneficial to repairing the first signal line 31 on the third surface C during manufacturing the first connection portions 21 on the second surface B, thus reducing the probability of the first signal line 31 being broken.

A display panel is provided in an embodiment of the present application and includes a display region and a non-display region located on at least one side of the display region. The display panel further includes a first substrate. The portion of the first substrate corresponding to the non-display region includes a first surface parallel to the display region and a second surface perpendicular to the display region. The second surface is located on a side of the first substrate spaced from the display region, and the thickness of the first base on the second surface in the direction perpendicular to the first surface is less than the thickness of the first base on the first surface in the direction perpendicular to the first surface. The first substrate further includes at least two third surfaces connecting the first surface and the second surface. The display panel further includes multiple first connection portions disposed on the second surface and multiple first signal lines tracing through the at least two third surfaces and the first surface. The first connection portions are electrically connected to corresponding first signal lines and transmit display signals to the display region through the corresponding first signal lines.

The side binding technology is adopted in the embodiment of the present disclosure. That is, the first connection portions are disposed on the second surface of the first substrate to greatly reduce the width of the non-display region of the display panel (i.e. the length of the non-display region in the direction from the display region towards the non-display region), which is beneficial to the implementation of the narrow bezel of the hard screen. In addition, the first substrate includes at least two third surfaces, and the first signal lines electrically connected to the first connection portions trace through the inclined third surfaces. The first signal lines on the third surfaces formed during manufacturing the first signal lines on the first surface may be incomplete. The third surfaces are inclined surfaces, which is beneficial to repairing the first signal line on the third surfaces during manufacturing the first connection portions on the second surface, so as to form a complete structure of the first signal lines on the third surface, reducing the probability of the first signal line on the third surfaces being broken, and further reducing the probability of the first signal line being broken. Moreover, the third surfaces are disposed so that the transition from the second surface of the first substrate to the first surface of the first substrate is closer to an arc transition, reducing the probability of the first signal line being broken.

Figure 10:
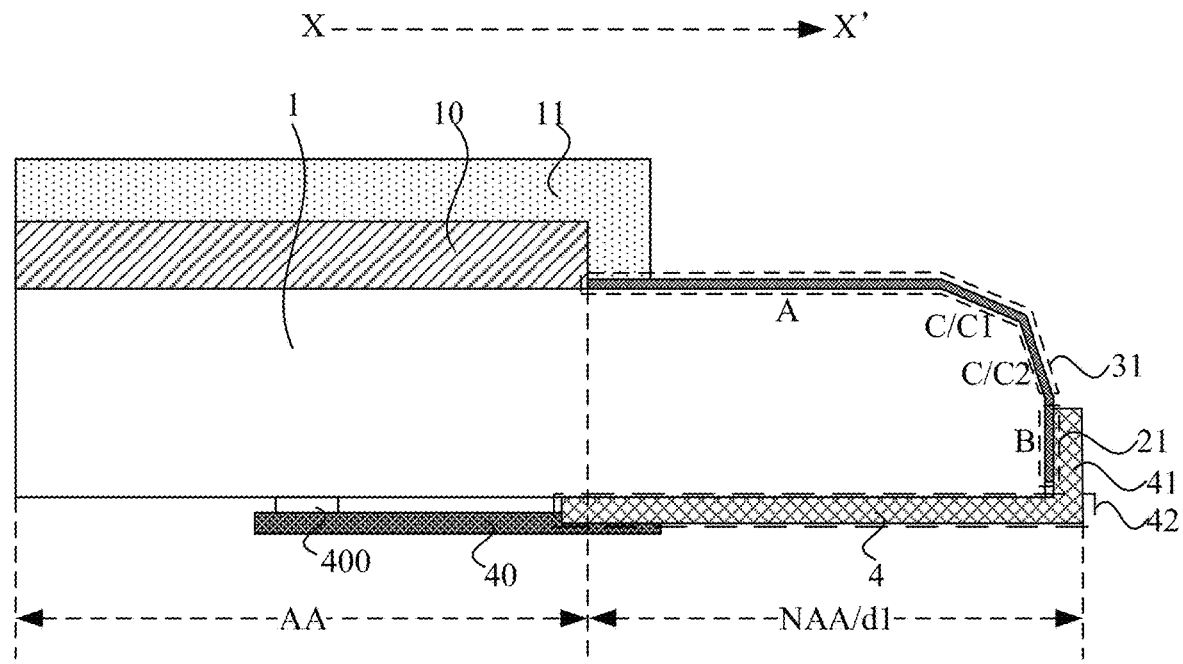
FIG. 10 is a schematic sectional view of a display panel having at least one third surface added on the basis of the embodiment of the present application shown in FIG. 1.
Figure 11:
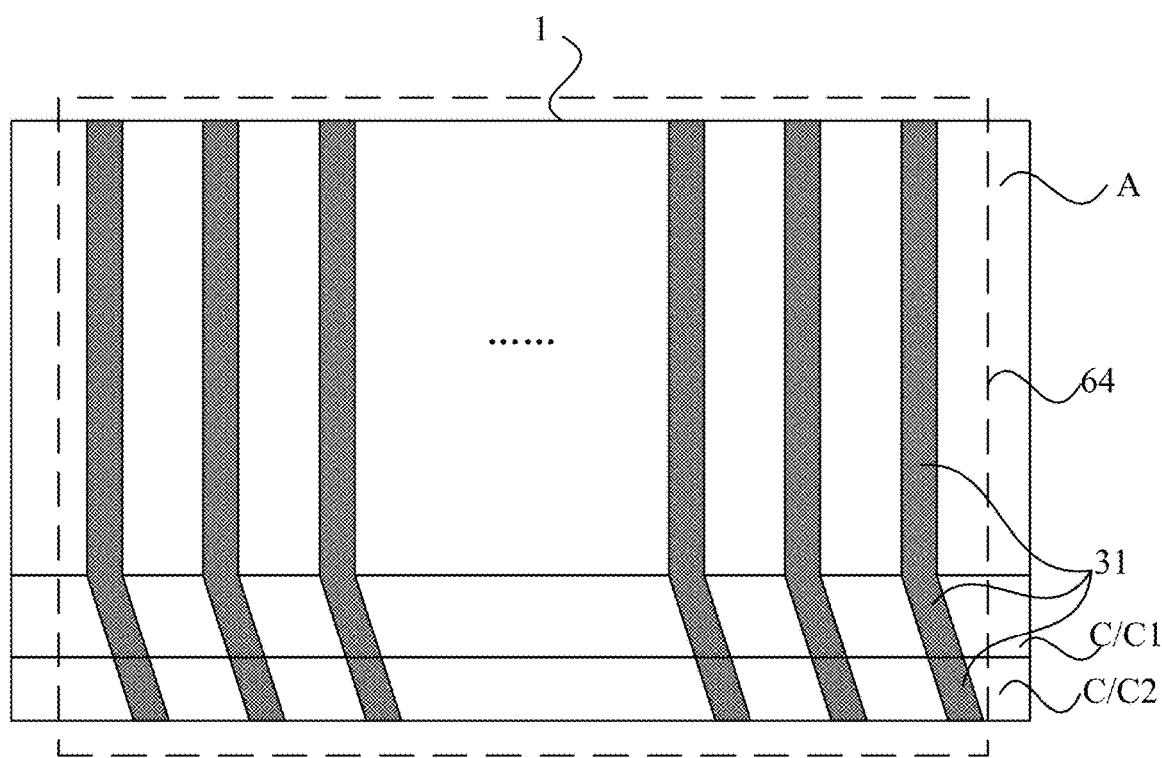
FIG. 11 is a schematic top view of a display panel shown in FIG. 10.
Figure 12:
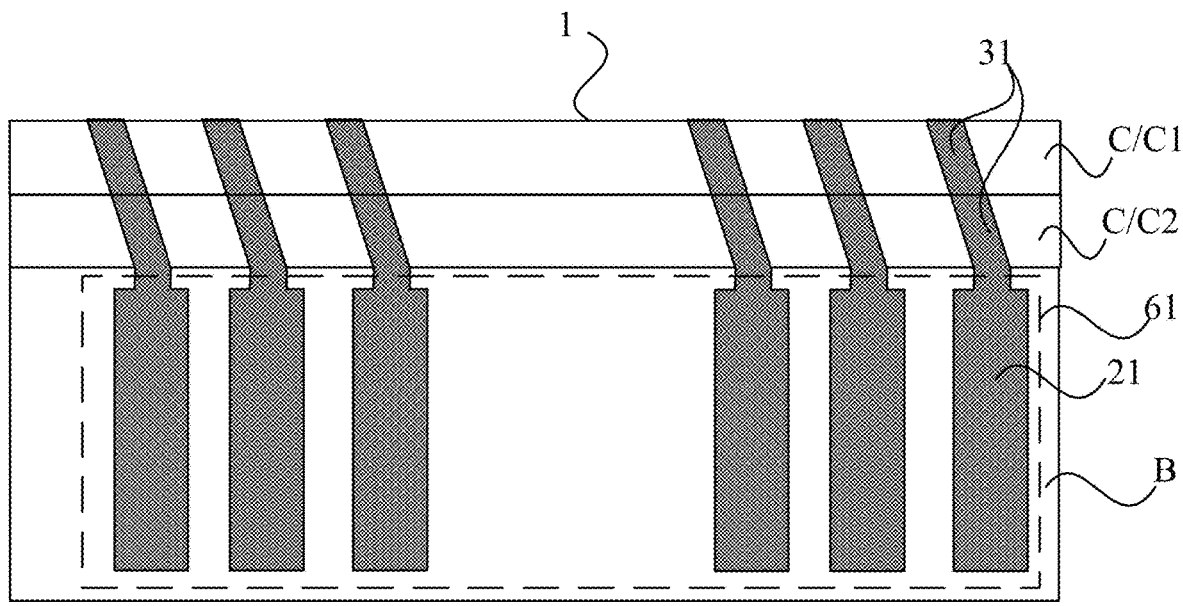
FIG. 12 is a schematic side view of a display panel shown in FIG. 10.

FIG. 10 is a schematic sectional view of a display panel having at least one third surface added on the basis of the embodiment of the present application shown in FIG. 1; FIG. 11 is a schematic top view of the display panel shown in FIG. 10; and FIG. 12 is a schematic side view of the display panel shown in FIG. 10. In conjunction with FIGS. 10 to 12, a display panel includes a display region AA and a non-display region NAA located on at least one side of the display region AA. Merely the non-display region NAA located on one side of the display region AA is shown here and may correspond to the lower bezel of the display panel.

The display panel further includes a first substrate 1. The first substrate 1 corresponds to the display region AA and the non-display region NAA. The first substrate 1 has a first base located at the non-display region NAA and the first base includes a first surface A, i.e., the upper surface of the first substrate 1, parallel to the display region AA and a second surface B, i.e., a side surface of the first substrate 1, perpendicular to the first surface A. The second surface B is inseparable from the first substrate 1. The thickness of the first base on the second surface B in the direction perpendicular to the first surface A is less than the thickness of the first base on the first surface A in the direction perpendicular to the first surface A. That is, the thickness of the first substrate 1 corresponding to the second surface B in the direction perpendicular to the display region AA is less than the thickness of the first substrate 1 corresponding to the first surface A in the direction perpendicular to the display region AA. That is, in the direction perpendicular to the first surface A of the first substrate 1, the thickness of the first substrate 1 corresponding to the second surface B is less than the thickness of the first substrate 1 corresponding to the first surface A.

The first substrate 1 further includes at least two third surfaces C connecting the first surface A and the second surface B. In the direction XX' in which the non-display region NAA is away from the display region AA, the second surface B is located on the side of the first substrate 1 spaced from the display region AA, and the thickness of the first substrate 1 corresponding to the second surface B in the direction perpendicular to the display region AA is less than the thickness of the first substrate 1 corresponding to the first surface A in the direction perpendicular to the display region AA. The display panel further includes multiple first connection portions 21 disposed on the second surface B and multiple first signal lines 31 that trace through the at least two third surfaces C and the first surface A. The first connection portions 21 are electrically connected to the corresponding first signal lines 31 and transmit display signals through the corresponding first signal lines 31.

The first substrate 1 of the display panel of the structure shown in FIG. 10 includes two third surfaces C.

Exemplarily, in conjunction with FIGS. 10 to 12, the first substrate 1 may be a glass substrate. The display panel to be an organic light-emitting display panel is used as an example. The portion of the first substrate 1 corresponding to the display region AA is provided with structures such as an organic light-emitting display device 10 and a thin-film encapsulation layer 11. The second surface B of the first substrate 1 is provided with multiple first connection portions 21. A driver chip (not shown) transmits display signals through the multiple first connection portions 21 and the multiple first signal lines 31 disposed in one-to-one correspondence with the multiple first connection portions 21. For example, a data signal may be transmitted to the display region AA of the display panel or a clock signal may be transmitted to the non-display region NAA of the display panel.

In conjunction with FIGS. 10 to 12, the first connection portions 21 for implementing binding with the driver chip are all located on the second surface B of the first substrate 1 and the first connection portions 21 transmit the display signals through the multiple first signal lines 31 which trace through the at least two third surfaces C and the first surface A. Therefore, electrical connection relationships of the first connection portions 21 are implemented to transmit the display signals and at the same time, the width of the non-display region NAA of the display panel in the direction XX' from the display region AA towards the non-display region NAA (i.e., the length of the non-display region NAA in the direction from the display region AA towards the non-display region NAA) is greatly reduced by adopting a side binding technology. That is, the magnitude of d1 in FIG. 10 is greatly reduced, which is beneficial to the implementation of a narrow bezel of a hard screen. In addition, the first substrate 1 includes the at least two third surfaces C and the first signal lines 31 electrically connected to the first connection portions 21 trace through the third surfaces C. The first signal lines 31 on the third surface C formed during manufacturing the first signal lines 31 on the first surface A may be incomplete. The third surfaces C are inclined surfaces, which is beneficial to repairing the first signal line 31 on the third surfaces C during manufacturing the first connection portions 21 on the second surface B, thus greatly reducing the probability of the first signal line 31 on the third surface C being broken, and further reducing the probability of the first signal line 31 being broken. Moreover, the third surfaces are disposed so that the transition from the second surface B of the first substrate 1 to the first surface A of the first substrate 1 is closer to an arc transition, reducing the probability of the first signal line 31 being broken.

The included angle between two adjacent third surfaces C is greater than or equal to 20° and less than 80°. The third surfaces C make the transition from the second surface B of the first substrate 1 to the first surface A of the first substrate 1 closer to the arc transition. Therefore, the probability of the first signal line 31 being broken is reduced and the uniformity of changes in a bending angle of the first substrate 1 from the second surface B to the third surfaces C and a bending angle of the first substrate 1 from the third surfaces C to the first surface A are improved, avoiding abrupt changes in the bending angle of the first substrate 1 from the second surface B to the third surfaces C and the bending angle of the first substrate 1 from the third surfaces C to the first surface A, and further reducing the impact of the first signal line 31 being broken on the display effect of the display panel.

The included angle between adjacent third surfaces C is equal to both the included angle between the first surface A and one of the third surfaces C and the included angle between the second surface B and the other one of the third surfaces C.

As shown in FIG. 10, the first substrate 1 exemplarily includes two third surfaces C, and the following included angles may be configured to be equal: the included angle between the first surface A and a third surface C1, the included angle between the third surface C1 and a third surface C2, and the included angle between the third surface C2 and the second surface B. The first substrate 1 includes at least two third surfaces C, and the included angle between adjacent third surfaces C is equal to both the included angle between the third surface C connected to the first surface A and the first surface A and the included angle between the third surface C connected to the second surface B and the second surface B. In this way, the transition from the first surface A to the second surface B is closer to the arc transition, thus reducing the probability of the first signal line 31 being broken, and further reducing the impact of the first signal line 31 being broken on the display effect of the display panel.

In an embodiment, in conjunction with FIG. 10, the display panel may further include a flexible circuit board 4 including a first portion 41 and a second portion 42. The first portion 41 of the flexible circuit board 4 is parallel to the second surface B and is provided with multiple first pads (not shown), and the multiple first pads are electrically connected to the first connection portions 21 on the second surface B correspondingly. The second portion 42 is parallel to the first surface A, and the second portion 42 of the flexible circuit board 4 is bent from one end of the first portion 41 to the surface of the first substrate 1 opposite the first surface A. Exemplarily, the flexible circuit board 4 may be provided with the driver chip that transmits the display signals to the first connection portions 21 disposed on the second surface B of the first substrate 1 through the flexible circuit board 4 and the multiple first pads in the first portion 41 of the flexible circuit board 4, thereby implementing the transmission of the display signals to the display panel. The driver chip may be disposed in the second portion 42 of the flexible circuit board 4. The second portion 42 of the flexible circuit board 4 is bent from one end of the first portion 41 to the surface of the first substrate 1 opposite the first surface A, so that the driver chip is also bent to the surface of the first substrate 1 opposite the first surface A, that is, to the lower surface of the first substrate 1. Therefore, the width of the non-display region NAA of the display panel in the direction XX' from the display region AA towards the non-display region NAA is reduced, which is beneficial to the implementation of the narrow bezel of the hard screen. In addition, the display panel may also include a first flexible circuit board 40, the flexible circuit board 4 may be electrically connected to the first flexible circuit board 40, and the first flexible circuit board is secured to the lower surface of the first substrate 1 through a securing structure 400.

Figure 13:
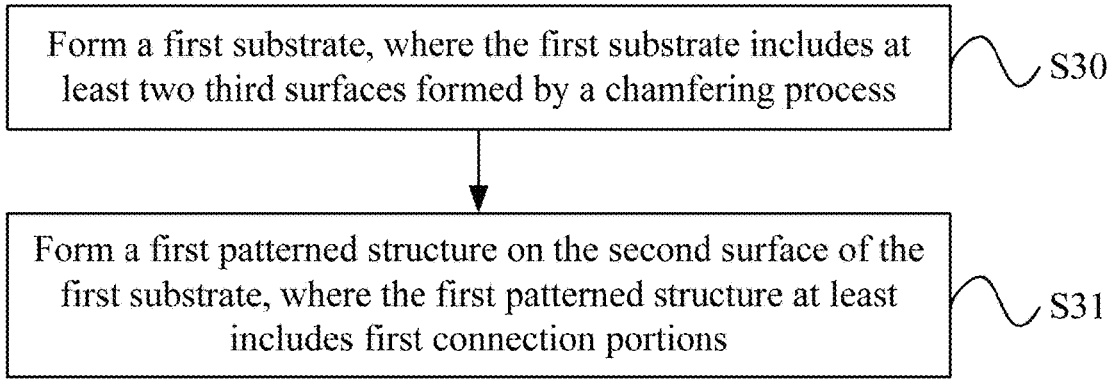
FIG. 13 is a flowchart illustrating a method for manufacturing the display panel shown in FIG. 10.

A method for manufacturing a display panel is further provided in an embodiment of the present application. FIG. 13 is a flowchart illustrating a method for manufacturing the display panel shown in FIG. 10. The manufacturing method is used for manufacturing the display panel described in the preceding embodiment. As shown in FIG. 13, the method for manufacturing the display panel includes steps S30 to S31.

In step S30, a first substrate is formed, where the first substrate includes at least two third surfaces formed by a chamfering process.

Figure 14:
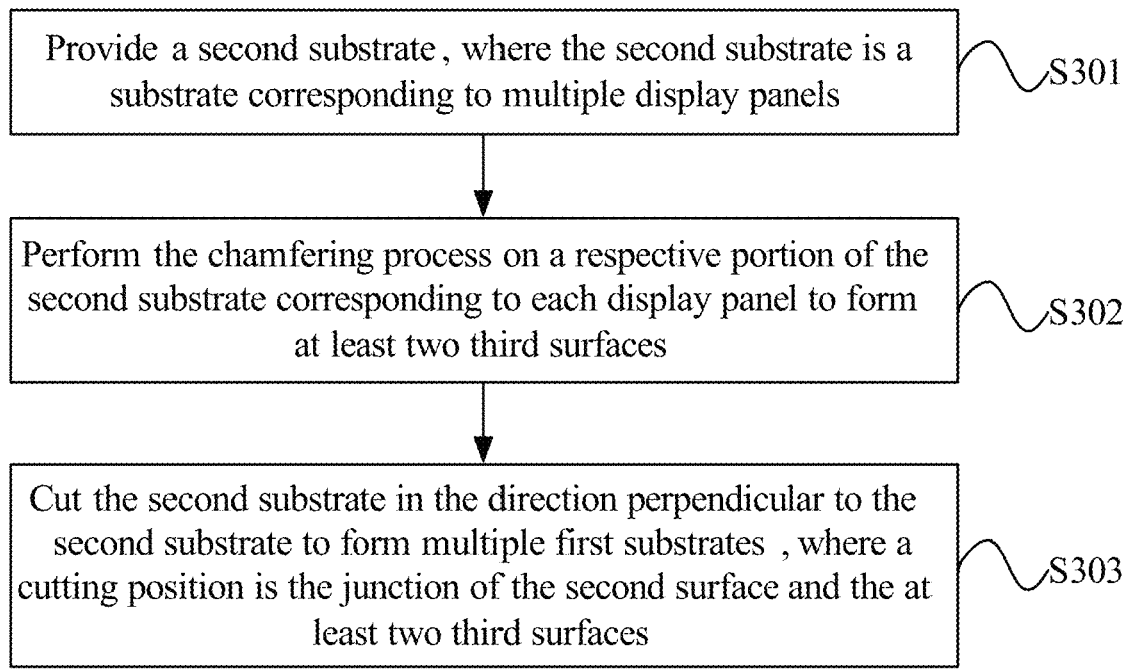
FIG. 14 is a flowchart illustrating a method for manufacturing a first substrate of the display panel shown in FIG. 10.

In conjunction with FIGS. 10 to 12, a first substrate 1 is formed, and the chamfering process may be formed on the first substrate 1 to form at least two third surfaces C. FIG. 14 is a schematic flowchart illustrating a method for manufacturing a first substrate of the display panel shown in FIG. 10. As shown in FIG. 14, the step in which the first substrate is formed includes steps S301 to S303.

In step S301, a second substrate is provided, where the second substrate is a substrate corresponding to multiple display panels.

Figure 15:
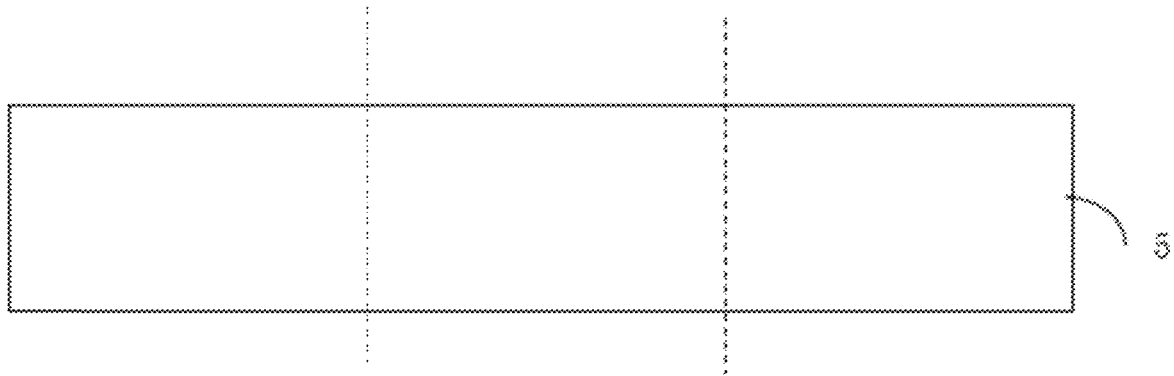
FIG. 15 is a schematic sectional view corresponding to a step of the manufacturing method shown in FIG. 14.

Exemplarily, as shown in FIG. 15, a second substrate 5 is provided and is a substrate corresponding to multiple display panels, and the multiple display panels are separated by two dotted lines of the second substrate 5 in FIG. 15.

In step S302, the chamfering process is performed on a respective portion of the second substrate corresponding to each display panel to form at least two third surfaces.

Figure 16:
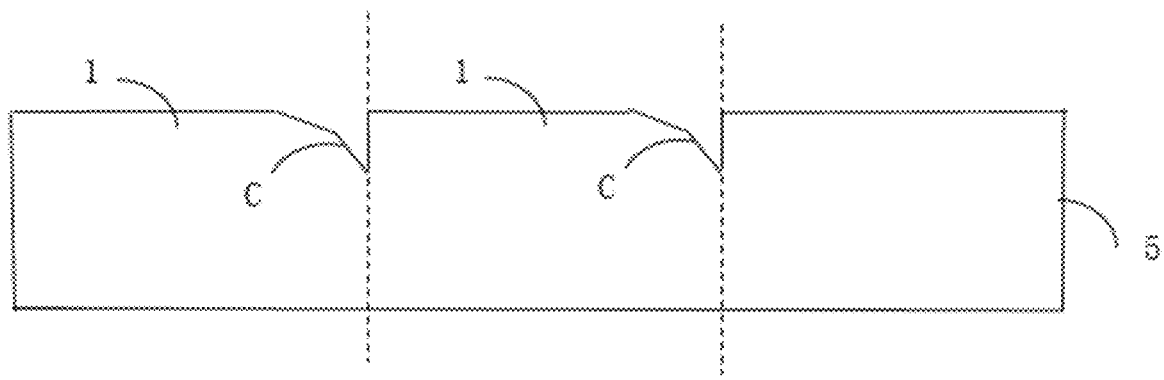
FIG. 16 is a schematic sectional view corresponding to a step of the manufacturing method shown in FIG. 14.

Exemplarily, as shown in FIG. 16, the chamfering process is performed on a respective portion of the second substrate 5 corresponding to each display panel to form at least two third surfaces C, and here the first substrate 1 of the display panel exemplarily includes two third surfaces C. Then, the display panel may be used as a processing unit and the chamfering process is performed at the corresponding position of the second substrate 5 to form the chamfer in the shape shown in FIG. 16, and the inclined surfaces of the chamfer are the third surfaces C of the corresponding first substrate 1.

In step S303, the second substrate is cut in the direction perpendicular to the second substrate to form multiple first substrates, where a cutting position is the junction of the second surface and the at least two third surfaces.

Figure 17:
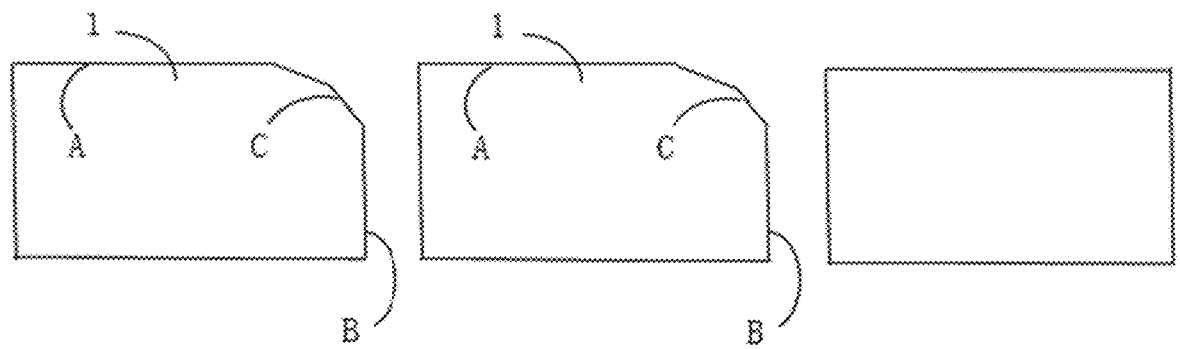
FIG. 17 is a schematic sectional view corresponding to a step of the manufacturing method shown in FIG. 14.

Exemplarily, as shown in FIG. 17, the second substrate 5 is cut in the direction perpendicular to the second substrate 5 to form multiple first substrates 1, and a cutting position is the junction of the second surface B and the at least two third surfaces C. Here, for example, the first substrate 1 of the display panel includes merely two third surfaces C. The second substrate 5 is cut at the positions of the dotted lines in FIG. 16 to form the multiple first substrates 1 shown in FIG. 17. The cut first substrate 1 has a first surface A (i.e., the upper surface of the first substrate 1), a second surface B perpendicular to the first surface A, and third surfaces C connecting the first surface A and the second surface B.

After the chamfering process is performed on the respective portion of the second substrate corresponding to each display panel to form the at least two third surfaces, the method for manufacturing a display panel further includes the following step: a fifth patterned structure is formed on the first surface and the third surfaces of the respective portion of the second substrate corresponding to each display panel, where the fifth patterned structure is composed of portions of the first signal lines located on the first surface and the third surfaces.

Exemplarily, in conjunction with FIGS. 10, 11 and 16, before the second substrate 5 is cut in the direction perpendicular to the second substrate 5 to form multiple first substrates 1, the chamfering process has been performed on the respective portion of the second substrate 5 corresponding to each display panel to form the third surfaces C of the first substrate 1, and a fifth patterned structure 64 may be formed on the first surface A and the third surfaces C of the respective portion of the second substrate 5 corresponding to each display panel, that is, the fifth patterned structure 64 is formed on the inclined surfaces of the chamfer and on the first surface A of the first substrate 1 connected to the inclined surfaces of the chamfer. The fifth patterned structure 64 is composed of the portions of the first signal lines 31 located on the first surface A and the third surfaces C. That is, such portions of the first signal lines 31 are manufactured before the second substrate 5 is cut to form the first substrates 1.

In step S31, a first patterned structure is formed on the second surface of the first substrate, where the first patterned structure at least includes first connection portions.

Exemplarily, in conjunction with FIGS. 10, 12 and 17, after the second substrate 5 is cut to form the first substrates 1, the second surface B of the first substrate 1 is exposed, and a first patterned structure 61 is formed on the second surface B of the first substrate 1, where the first patterned structure 61 at least includes multiple first connection portions 21. The first patterned structure 61 may include merely the multiple first connection portions 21; at this time, multiple first signal lines 31 trace merely through the first surface A and the third surfaces C. Alternatively, the first patterned structure 61 may include not only the multiple first connection portions 21 but also the portions of the multiple first signal lines 31 located on the second surface and electrically connected to the multiple first connection portions 21 respectively; at this time, the multiple first signal lines 31 trace through the first surface A and the third surfaces C then trace into the second surface B.

In conjunction with FIGS. 10 to 12 and FIGS. 16 and 17, during forming the first patterned structure 61 on the second surface B of the first substrate 1, a repair line may be formed on at least a portion of the third surfaces C of the first substrate 1, and the repair line is composed of a portion of the first signal lines 31 on the at least two third surfaces C. Exemplarily, before the second substrate 5 is cut to form the first substrates 1 and when the fifth patterned structure 64 is formed on the first surface A and the third surfaces C of the respective portion of the second substrate 5 corresponding to each display panel, it is possible that the complete first signal lines 31 shown in FIG. 11 cannot be formed on the third surfaces C since the third surfaces are inclined surfaces, resulting in an open circuit of the first signal line 31 electrically connected to the first connection portion 21, and thereby affecting the normal display effect of the display panel.

After the second substrate 5 is cut to form the multiple first substrates 1, the second surface B of the first substrate 1 is exposed. In addition, the chamfer is disposed, that is, the third surfaces C are disposed, so that during manufacturing the first patterned structure 61 on the second surface B, the incomplete first signal lines 31 on the third surfaces C may be repaired, so as to form the complete first signal lines 31 on the third surfaces C as shown in FIG. 11. Therefore, the breakage probability of the first signal line 31 electrically connected to the first connection portion 21 is greatly reduced, and the impact of the breakage of the first signal line 31 on the display effect of the display panel is further reduced.

Figure 18:
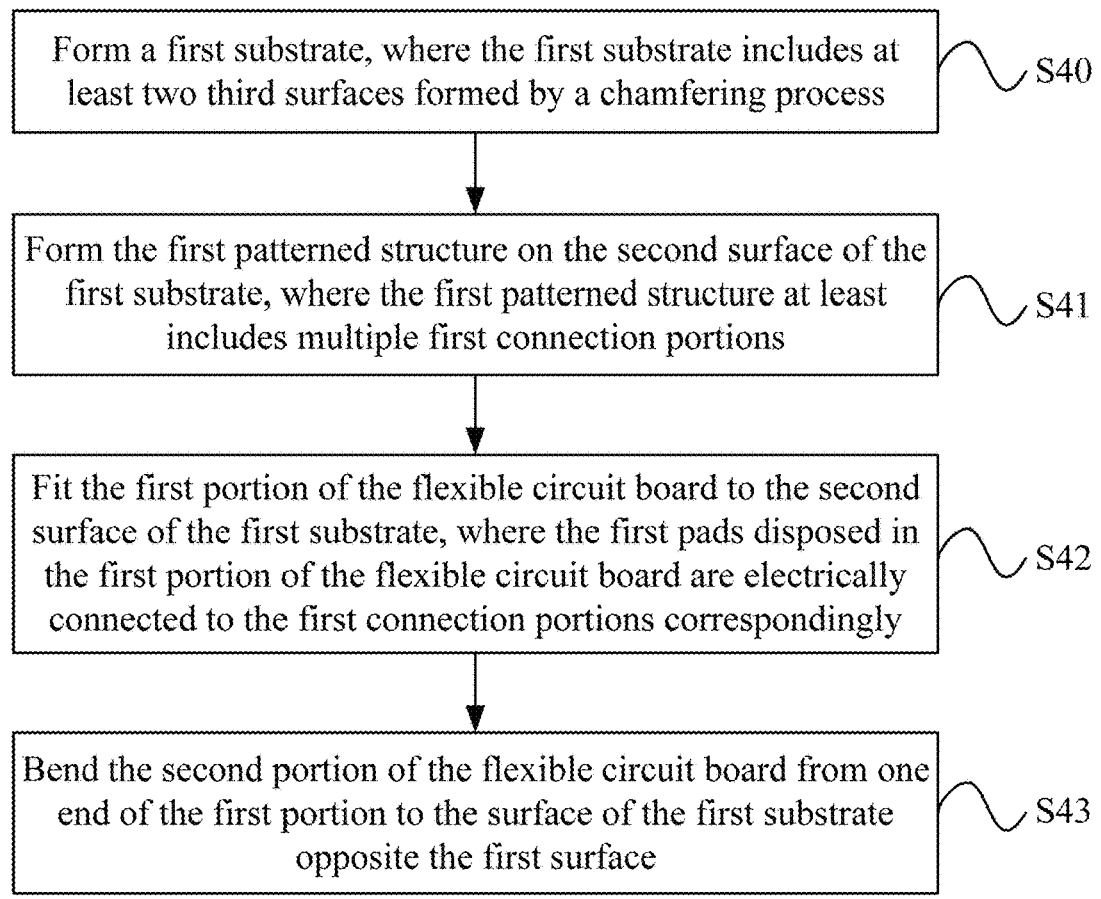
FIG. 18 is a flowchart illustrating a method for manufacturing the display panel shown in FIG. 10.

FIG. 18 is a flowchart illustrating a method for manufacturing the display panel shown in FIG. 10. Based on the method for manufacturing a display panel shown in FIG. 13, after the first patterned structure is formed on the second surface of the first substrate, the manufacturing method further includes the following step: the first portion of the flexible circuit board is fitted to the second surface of the first substrate, where the first pads disposed in the first portion of the flexible circuit board are electrically connected to the first connection portions correspondingly; the second portion of the flexible circuit board is bent from one end of the first portion to the surface of the first substrate opposite the first surface. As shown in FIG. 18, the manufacturing method includes steps S40 to S43.

In step S40, the first substrate is formed, where a chamfering process is performed on the first substrate to form at least two third surfaces.

In step S41, the first patterned structure is formed on the second surface of the first substrate, where the first patterned structure at least includes multiple first connection portions.

In step S42, the first portion of the flexible circuit board is fitted to the second surface of the first substrate, where the first pads disposed in the first portion of the flexible circuit board are electrically connected to the first connection portions correspondingly.

Exemplarily, in conjunction with FIGS. 10 to 12, the display panel may further include a flexible circuit board 4. A first portion 41 of the flexible circuit board 4 is provided with multiple first pads and is fitted to the second surface B of the first substrate 1. That is, the first pads disposed in the first portion 41 of the flexible circuit board 4 are electrically connected to the first connection portions 21 correspondingly. The flexible circuit board 4 may be provided with a driver chip that transmits display signals to the first connection portions 21 disposed on the second surface B of the first substrate 1 through the flexible circuit board 4 and the multiple first pads in the first portion 41 of the flexible circuit board 4, thereby implementing the transmission of the display signals to the display panel.

In step S43, the second portion of the flexible circuit board is bent from one end of the first portion to the surface of the first substrate opposite the first surface.

Exemplarily, in conjunction with FIGS. 10 to 12, the driver chip may be disposed in the second portion 42 of the flexible circuit board 4. The second portion 42 of the flexible circuit board 4 is bent from one end of the first portion 41 to the surface of the first substrate 1 opposite the first surface A, so that the driver chip is also bent to the surface of the first substrate 1 opposite the first surface A, that is, to the lower surface of the first substrate 1. Therefore, the width of the non-display region NAA of the display panel in the direction XX' from the display region AA towards the non-display region NAA is reduced, which is beneficial to the implementation of the narrow bezel of the hard screen.

According to the method for manufacturing a display panel in the embodiment of the present application, the side binding technology is implemented for the display panel, greatly reducing the width of the non-display region NAA of the display panel in the direction XX' from the display region AA towards the non-display region NAA, which is beneficial to the implementation of the narrow bezel of the hard screen. In addition, the at least two third surfaces C formed by the chamfering are beneficial to repairing the first signal lines 31 on the third surfaces C during manufacturing the first connection portions 21 on the second surface B, thus reducing the probability of the first signal line 31 being broken.

A display panel having a display region and a non-display region located on at least one side of the display region is provided in an embodiment of the present application. The display panel further includes a first substrate corresponding to the display region and the non-display region. The first substrate includes a first base located at the non-display region and the first base includes a first surface and a second surface perpendicular to the first surface. The second surface is inseparable from the first surface. The thickness of the first substrate corresponding to the second surface in the direction perpendicular to the display region is less than the thickness of the first substrate corresponding to the first surface in the direction perpendicular to the display region. The first substrate further includes at least one third surface connecting the first surface and the second surface. The display panel further includes multiple first connection portions disposed on the second surface and multiple second connection portions disposed on one third surface. The first connection portions transmit display signals through multiple first signal lines which trace through at least one third surface and the first surface. The second connection portions transmit display signals through multiple second signal lines which trace at least through the first surface.

The side binding technology is adopted in the embodiment of the present applications. That is, the first connection portions are disposed on the second surface of the first substrate and the second connection portions are disposed on one third surface of the first substrate, so as to greatly reduce the width of the non-display region of the display panel in the direction from the display region towards the non-display region, which is beneficial to the implementation of the narrow bezel of the hard screen. In addition, the first substrate includes at least one third surface, so that space is provided for disposing the second connection portions to reduce the width of the non-display region of the display panel in the direction from the display region towards the non-display region and at the same time to facilitate repairing of the signal line on the third surface and repairing of the second connection portion during manufacturing the first connection portions on the second surface. Therefore, the probability of an open circuit in the path from the connection portion to the corresponding signal line is reduced. Moreover, the at least one disposed third surface make the transition from the second surface of the first substrate to the first surface of the first substrate closer to an arc transition, reducing the probability of the signal line being broken. In addition, the display panel includes the multiple first connection portions disposed on the second surface and the multiple second connection portions disposed on one third surface; the arrangement of the double rows of connection portions enables the display panel to be designed with more data signal lines, that is, the display panel may include more pixel units, which is beneficial to improving the resolution of the display panel. Moreover, the arrangement of the double rows of connection portions is beneficial to increasing the binding area of the flexible circuit board and the display panel and improving the binding stability of the flexible circuit board and the display panel.

Figure 19:
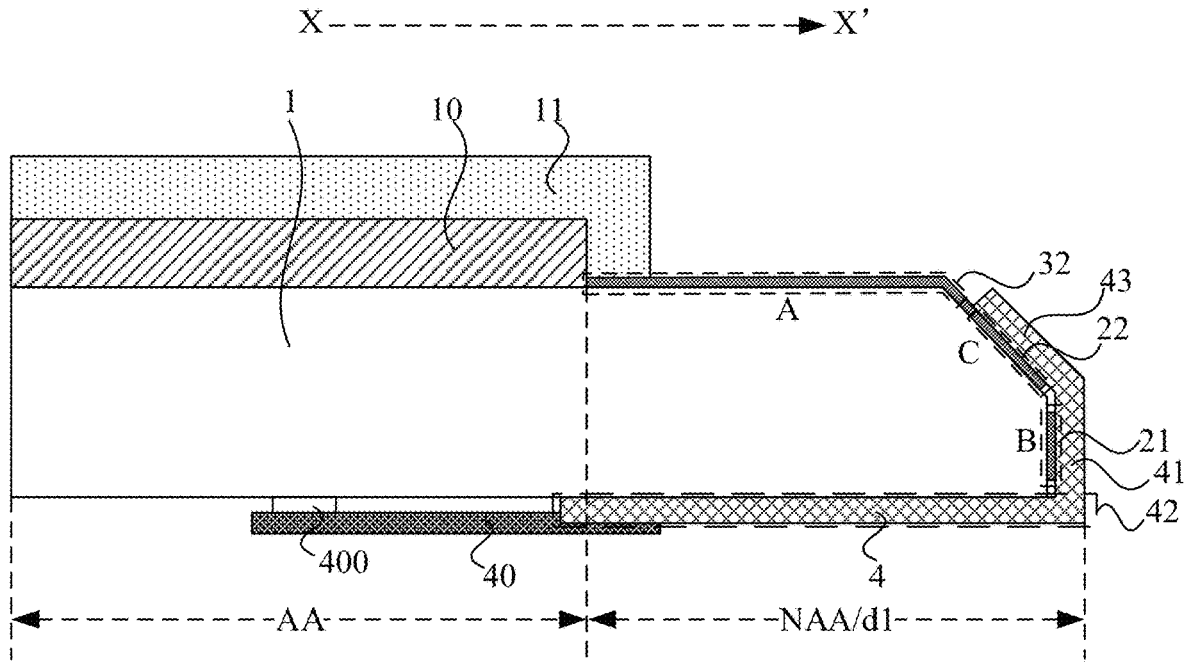
FIG. 19 is a schematic sectional view of a display panel having a second connection portion added to a third surface on the basis of the embodiment shown in FIG. 1.
Figure 20:
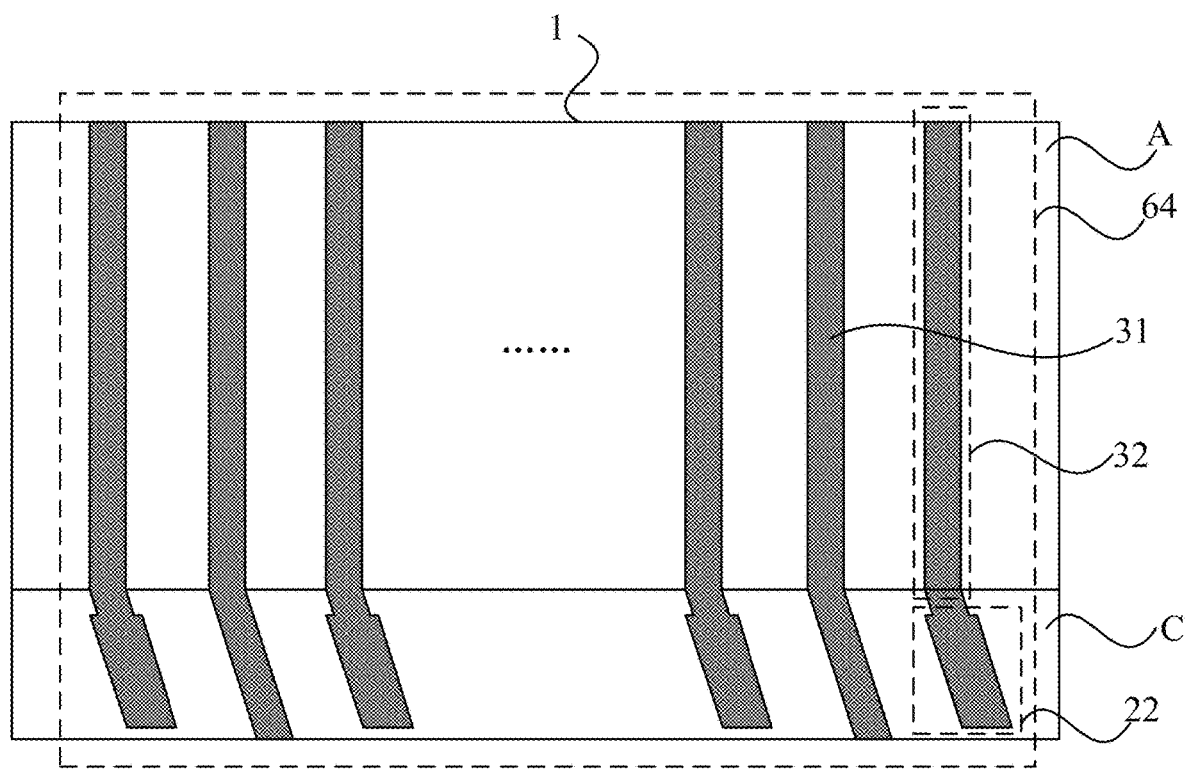
FIG. 20 is a schematic top view of the display panel shown in FIG. 19.
Figure 21:
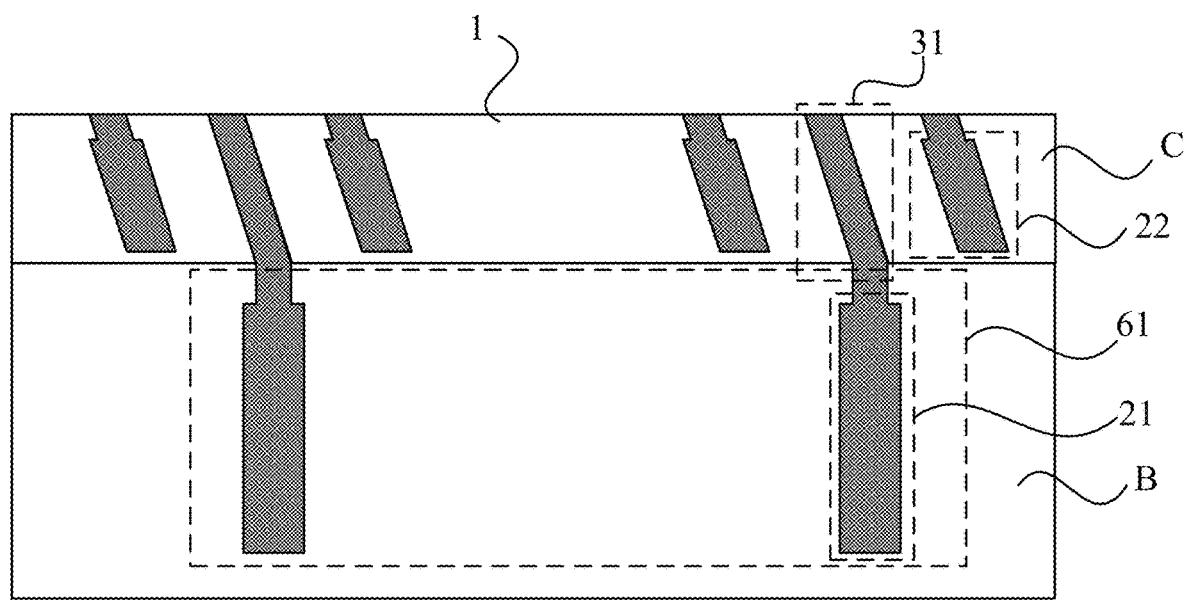
FIG. 21 is a schematic side view of the display panel shown in FIG. 19.

FIG. 19 is a schematic sectional view of a display panel having a second connection portion added to a third surface on the basis of the embodiment shown in FIG. 1; FIG. 20 is a schematic top view of the display panel shown in FIG. 19; and FIG. 21 is a schematic side view of the display panel shown in FIG. 19. In conjunction with FIGS. 19 to 21, a display panel includes a display region AA and a non-display region NAA located on at least one side of the display region AA. Merely the non-display region NAA located on one side of the display region AA is shown here and may correspond to the lower bezel of the display panel.

The display panel further includes a first substrate 1. The first substrate 1 includes a first base located at the non-display region NAA and the first base includes a first surface A, i.e., the upper surface of the first substrate 1, and a second surface B, i.e., a side surface of the first substrate 1, perpendicular to the first surface A. In the direction XX' from the display region AA towards the non-display region NAA, the second surface B is located on the side of the first surface A spaced from the display region AA, and the thickness of the first substrate 1 corresponding to the second surface B in the direction perpendicular to the display region AA is less than the thickness of the first substrate 1 corresponding to the first surface A in the direction perpendicular to the display region AA. That is, in the direction perpendicular to the first surface A of the first substrate 1, the thickness of the first substrate 1 corresponding to the second surface B is less than the thickness of the first substrate 1 corresponding to the first surface A.

The first substrate 1 further includes at least one third surface C connecting the first surface A and the second surface B. In the direction XX' from the display region AA towards the non-display region NAA, the second surface B is located on the side of the first surface A spaced from the display region AA and the thickness of the first substrate 1 corresponding to the second surface B in the direction perpendicular to the display region AA is less than the thickness of the first substrate 1 corresponding to the first surface A in the direction perpendicular to the display region AA, so an inclined third surface C as shown in FIG. 19 is formed (the first substrate 1 including one third surface C is used as an example in FIG. 19). The display panel further includes multiple first connection portions 21 disposed on the second surface B and multiple second connection portions 22 disposed on one third surface C. The first connection portions 21 transmit display signals through multiple first signal lines 31 which trace through at least one third surface C and the first surface A. The second connection portions 22 transmit display signals through multiple second signal lines 32 which trace at least through the first surface A.

Exemplarily, in conjunction with FIGS. 19 to 21, the first substrate 1 may be a glass substrate. The display panel to be an organic light-emitting display panel is used as an example. The portion of the first substrate 1 corresponding to the display region AA is provided with structures such as an organic light-emitting display device 10 and a thin-film encapsulation layer 11. The second surface B of the first substrate 1 is provided with multiple first connection portions 21. A driver chip (not shown) transmits display signals through the first connection portions 21 and the first signal lines 31 disposed in one-to-one correspondence with the first connection portions 21. One third surface C of the first substrate 1 is provided with multiple second connection portions 22. The driver chip transmits display signals through the second connection portions 22 and the second signal lines 32 disposed in one-to-one correspondence with the second connection portions. The driver chip may transmit data signals to pixel units of different columns in the display region AA through the first connection portions 21 and the second connection portions 22. The display panel includes the multiple first connection portions 21 disposed on the second surface B and the multiple second connection portions 22 disposed on the third surface C, that is, the display panel includes double rows of connection portions in the direction XX' from the display region AA towards the non-display region NAA, and the orthographic projection length of the second connection portions in the direction parallel to the first surface is equal to the orthographic projection length of the first connection portions in the direction perpendicular to the first surface. The arrangement of the double rows of connection portions enables the display panel to be designed with more data signal lines, that is, the display panel may include more pixel units, which is beneficial to improving the resolution of the display panel. Moreover, the arrangement of the double rows of connection portions is beneficial to increasing the binding area of the flexible circuit board and the display panel and improving the binding stability of the flexible circuit board and the display panel.

In conjunction with FIGS. 19 to 21, the first connection portions 21 for implementing binding with the driver chip are all located on the second surface B of the first substrate 1, the second connection portions 22 are located on the third surface C of the first substrate 1, the first connection portions 21 transmit the display signals through the multiple first signal lines 31 which trace at least through the at least one third surface C and the first surface A, and the second connection portions 22 transmit the display signals through the multiple second signal lines 32 which trace at least through the first surface A. In this way, electrical connection relationships of the first connection portions 21 and the second connection portions 22 are implemented to transmit the display signals, and at the same time, the width of the non-display region NAA of the display panel in the direction XX' from the display region AA towards the non-display region NAA is greatly reduced by adopting a side binding technology. That is, the magnitude of d1 in FIG. 19 is greatly reduced, which is beneficial to the implementation of a narrow bezel of a hard screen. In addition, the first substrate 1 includes at least one third surface C, which is beneficial to repairing the signal lines on the third surface C and the second connection portion 22 during manufacturing the first connection portions 21 on the second surface B. The signal lines on the third surface C may include the portion of the first signal lines 31 on the third surface C and the portion of the second signal lines 32 on the third surface C. A probability of an open circuit exists in the path between the connection portion and the corresponding signal line. The third surface C is disposed so that the transition from the second surface B of the first substrate 1 to the first surface A of the first substrate 1 is closer to the arc transition, thereby reducing the probability of the signal line 3 being broken.

In conjunction with FIGS. 19 to 21, the first substrate 1 may include one third surface C; the included angle between the third surface C and the first surface A and the included angle between the third surface C and the second surface B are 45°. Exemplarily, the second surface B of the first substrate 1 is provided with multiple first connection portions 21 and the third surface C is provided with multiple second connection portions 22. The first connection portions 21 transmit display signals through multiple first signal lines 31 which trace at least through the third surface C and the first surface A. The second connection portions 22 transmit display signals through multiple second signal lines 32 which trace at least through the first surface A. The first substrate 1 includes one third surface C; the included angle between the third surface C and the first surface A is 45°, and the included angle between the third surface C and the second surface B is 45°. In this way, the bending angle of the first substrate 1 from the second surface B to the third surface C and the bending angle of the first substrate 1 from the third surface C to the first surface A uniformly change, avoiding abrupt changes in the bending angle of the first substrate 1 from the second surface B to the third surface C and the bending angle of the first substrate 1 from the third surface C to the first surface A, reducing the probabilities of the first signal line 31 and the second signal line 32 being broken, and further reducing the impact of the first signal line 31 and the second signal line 32 being broken on the display effect of the display panel. In addition, the third surface C may be formed by a chamfering process and the first substrate 1 including merely one third surface C is beneficial to reducing the process difficulty of the chamfering process performed on the first substrate 1 to form the third surface C.

Figure 22:
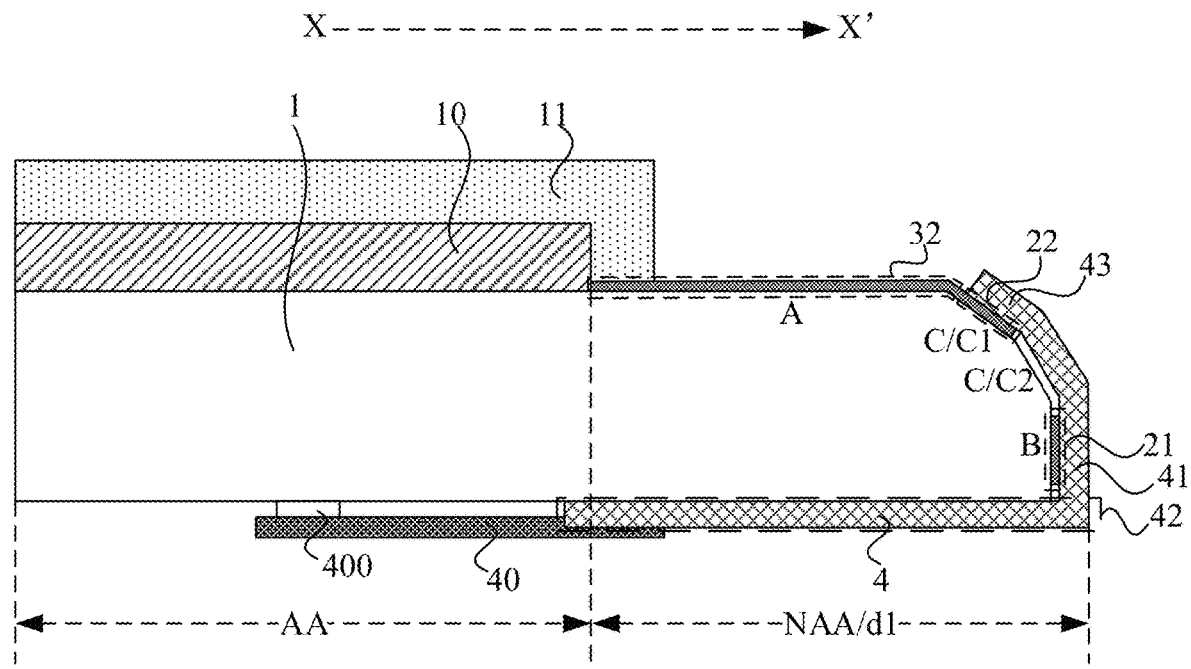
FIG. 22 is a schematic sectional view of a display panel having one third surface added on the basis of the embodiment shown in FIG. 19.

FIG. 22 is a schematic sectional view of a display panel having one third surface added on the basis of the embodiment shown in FIG. 19. Unlike the display panels of structures shown in FIGS. 19 to 21, the first substrate 1 of the display panel of the structure shown in FIG. 22 includes multiple third surfaces C. The included angle between adjacent third surfaces C is equal to both the included angle between the third surface C connected to the first surface A and the first surface A and the included angle between the third surface C connected to the second surface B and the second surface B. The second connection portions 22 may be disposed on the third surface C connected to the first surface A.

As shown in FIG. 22, the first substrate 1 exemplarily includes two third surfaces C1 and C2, and the following included angles may be configured to be equal: the included angle between the first surface A and the third surface C1, the included angle between the third surface C1 and the third surface C2, and the included angle between the third surface C2 and the second surface B. The first substrate 1 includes multiple third surfaces C rather than include merely one third surface C, and the included angle between adjacent third surfaces C is equal to both the included angle between the third surface C connected to the first surface A and the first surface A and the included angle between the third surface C connected to the second surface B and the second surface B. In this way, the transition from the first surface A to the second surface B is closer to the arc transition, thus reducing the probabilities of the first signal line 31 and the second signal line 32 being broken, and further reducing the impact of the first signal line 31 and the second signal line 32 being broken on the display effect of the display panel. In addition, the second connection portions 22 are disposed on the third surface C connected to the first surface A, for example, the second connection portions 22 are disposed on the third surface C1. In this way, implementation of the narrow bezel of the display panel is facilitated by adopting the side binding technology, and at the same time, the second signal lines 32 electrically connected to the second connection portions 22 trace through the third surface C1 and the first surface A or merely through the first surface A, reducing the probability of breakage of the second signal line 32 electrically connected to the second connection portion 22.

Figure 23:
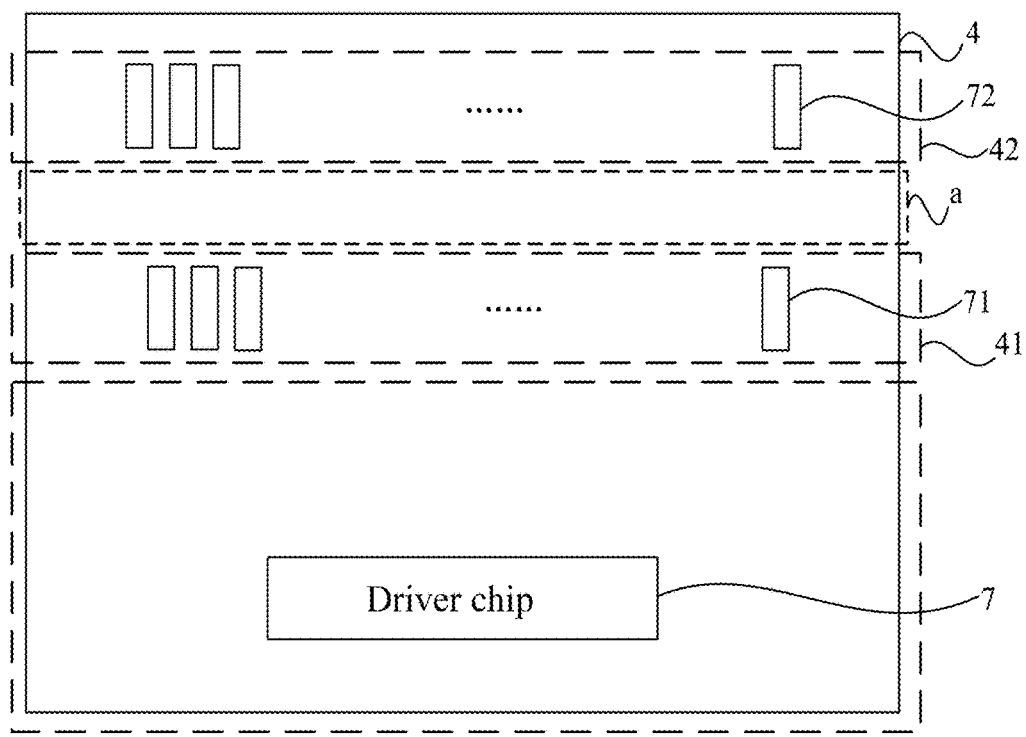
FIG. 23 is a schematic top view of a flexible circuit board according to an embodiment of the present application.

The display panel may further include a flexible circuit board. FIG. 23 is a schematic top view of a flexible circuit board according to an embodiment of the present application. In conjunction with FIGS. 19 to 23, the first portion 41 of the flexible circuit board 4 is provided with multiple first pads 71, and the third portion 43 of the flexible circuit board 4 is provided with multiple second pads 72. The first pads 71 are electrically connected to the first connection portions 21 correspondingly, that is, the first portion 41 of the flexible circuit board 4 is disposed corresponding to the multiple first connection portions 21. The second pads 72 are electrically connected to the second connection portions 22 correspondingly, that is, the third portion 43 of the flexible circuit board 4 is disposed corresponding to the multiple second connection portions 22. The flexible circuit board 4 includes a PI film, and the thickness of the PI film corresponding to a first region between the multiple first pads 71 and the multiple second pads 72 is less than the thickness of the PI film corresponding to a second region of the flexible circuit board 4 except the first region. Exemplarily, the thickness of the PI film corresponding to the first region between the multiple first pads 71 and the multiple second pads 72 may be set to be less than or equal to 150 μm.

Exemplarily, a driver chip 7 may be disposed on the flexible circuit board 4. The driver chip 7 transmits display signals to the first connection portions 21 disposed on the second surface B of the first substrate 1 through the flexible circuit board 4 and the multiple first pads 71 in the first portion 41 of the flexible circuit board 4. The driver chip 7 transmits display signals to the second connection portions 22 disposed on the third surface C of the first substrate 1 through the flexible circuit board 4 and the multiple second pads 72 in the third portion 43 of the flexible circuit board 4. In this way, the transmission of the display signals to the display panel is implemented.

The thickness of the PI film corresponding to the region between the multiple first pads 71 and the multiple second pads 72, i.e., the thickness of the PI film of the flexible circuit board 4 in region a, is less than the thickness of the PI film corresponding to the other region of the flexible circuit board 4. In this way, the region between the multiple first pads 71 and the multiple second pads 72 corresponding to the flexible circuit board 4 is more easily bent. That is, the bending difficulty of the region between the multiple first pads 71 and the multiple second pads 72 corresponding to the flexible circuit board 4 is reduced. Therefore, the difficulty of the first pads 71 of the flexible circuit board 4 being electrically connected to the first connection portions 21 correspondingly and the difficulty of the second pads 72 being electrically connected to the second connection portions 22 correspondingly are also reduced.

In addition, with reference to FIGS. 19 and 22, the driver chip 7 may be disposed in the second portion 42 of the flexible circuit board 4. The second portion 42 of the flexible circuit board 4 is bent from the first portion 41 to the surface of the first substrate 1 opposite the first surface A, so that the driver chip 7 is also bent to the surface of the first substrate 1 opposite the first surface A, that is, to the lower surface of the first substrate 1. Therefore, the width of the non-display region NAA of the display panel in the direction XX' from the display region AA towards the non-display region NAA is reduced, which is beneficial to the implementation of the narrow bezel of the hard screen. In addition, the display panel may further include a first flexible circuit board 40, the flexible circuit board 4 may be electrically connected to the first flexible circuit board 40, and the first flexible circuit board is secured to the lower surface of the first substrate 1 through a securing structure 400.

According to the embodiment of the present application, the resolution of the display panel and the binding stability of the flexible circuit board and the display panel are improved; at the same time, by adopting the side binding technology, the width of the non-display region NAA of the display panel in the direction XX' from the display region AA towards the non-display region NAA is greatly reduced, which is beneficial to the implementation of a narrow bezel of a hard screen. In addition, the first substrate 1 includes at least one third surface C to facilitate repairing of the signal line on the third surface C and repairing of the second connection portion 22 during manufacturing the first connection portions 21 on the second surface B. Therefore, the probability of an open circuit in the path from the connection portion to the corresponding signal line is reduced. Moreover, the third surface C is disposed so that the transition from the second surface B of the first substrate 1 to the first surface A of the first substrate 1 is closer to an arc transition, reducing the probability of the signal line 3 being broken.

Figure 24:
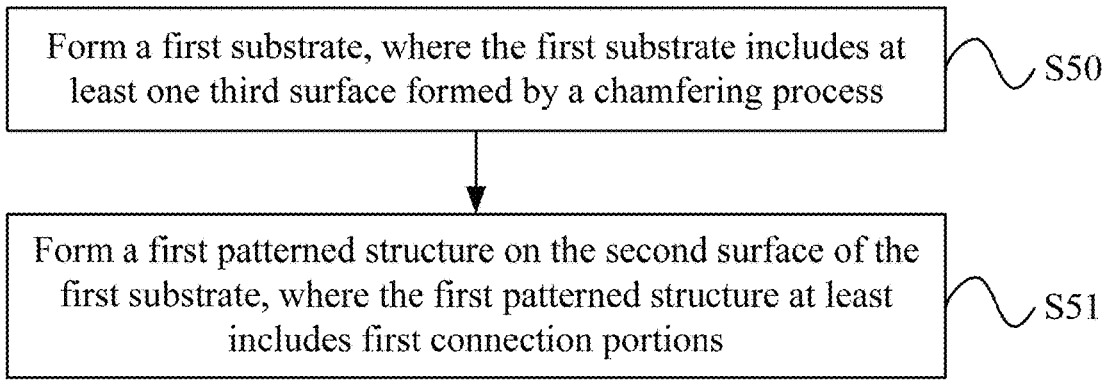
FIG. 24 is a flowchart illustrating a method for manufacturing the display panel shown in FIG. 19.

A method for manufacturing a display panel is further provided in an embodiment of the present application. FIG. 24 is a flowchart illustrating a method for manufacturing the display panel shown in FIG. 19. The manufacturing method is used for manufacturing the display panel described in the preceding embodiment. As shown in FIG. 24, the method for manufacturing the display panel includes steps S50 to S51.

In step S50, a first substrate is formed, where a chamfering process is performed on the first substrate to form at least one third surface.

Figure 25:
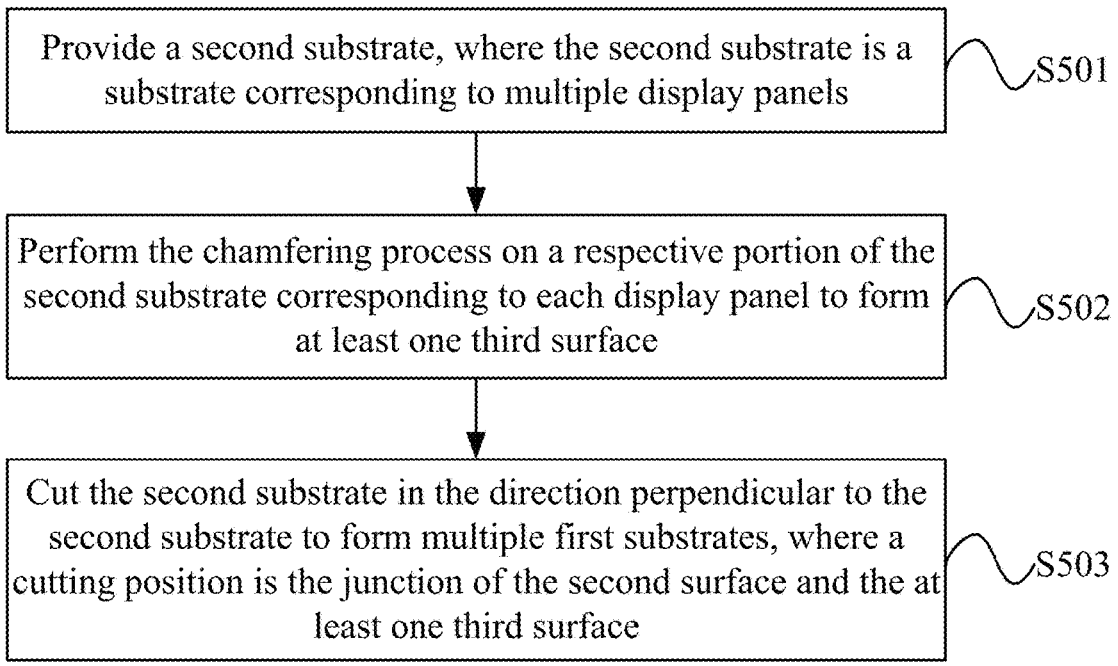
FIG. 25 is a flowchart illustrating a method for manufacturing a first substrate of the display panel shown in FIG. 19.

In conjunction with FIGS. 19 to 22, a first substrate 1 is formed, and the chamfering process may be formed on the first substrate 1 to form at least one third surface C. FIG. 25 is a flowchart illustrating a method for manufacturing a first substrate of the display panel shown in FIG. 19. As shown in FIG. 25, the step in which the first substrate is formed includes steps S501 to S503.

In step S501, a second substrate is provided, where the second substrate is a substrate corresponding to multiple display panels.

Figure 26:
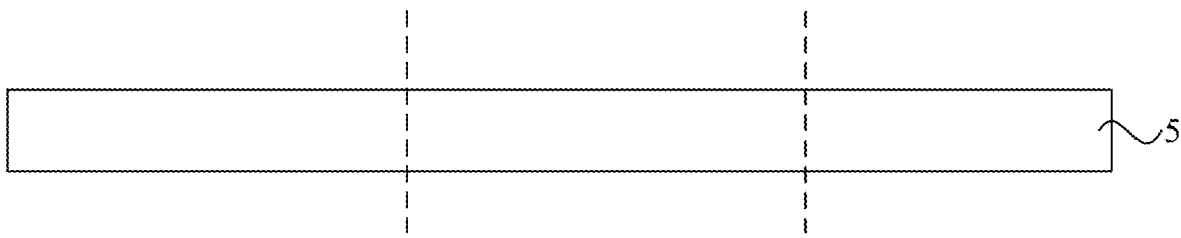
FIG. 26 is a schematic sectional view corresponding to a step of the manufacturing method shown in FIG. 25.

Exemplarily, as shown in FIG. 26, a second substrate 5 is provided and is a substrate corresponding to multiple display panels, and the multiple display panels are separated by two dotted lines of the second substrate 5 in FIG. 26.

In step S502, the chamfering process is performed on a respective portion of the second substrate corresponding to each display panel to form at least one third surface.

Figure 27:
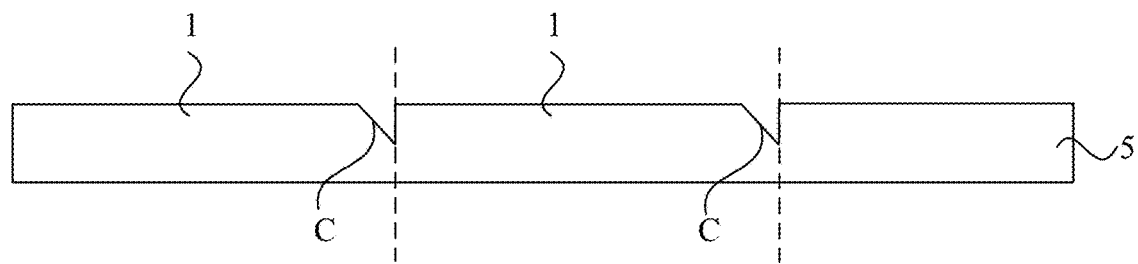
FIG. 27 is a schematic sectional view corresponding to a step of the manufacturing method shown in FIG. 25.

Exemplarily, as shown in FIG. 27, the chamfering process is performed on a respective portion of the second substrate 5 corresponding to each display panel to form at least one third surface C, and here the first substrate 1 of the display panel exemplarily includes one third surface C. Then, the display panel may be used as a processing unit and the chamfering process is performed at the corresponding position of the second substrate 5 to form the chamfer in the shape shown in FIG. 27. The inclined surface of the chamfer is the third surface C of the corresponding first substrate 1.

In step S503, the second substrate is cut in the direction perpendicular to the second substrate to form multiple first substrates, where a cutting position is the junction of the second surface and the at least one third surface.

Figure 28:
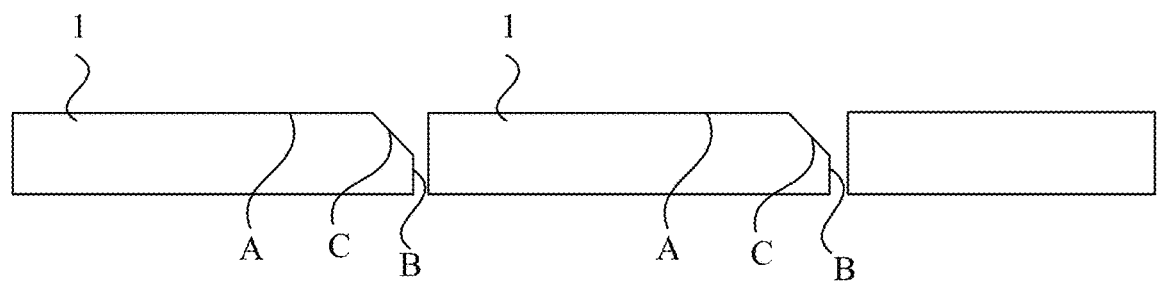
FIG. 28 is a schematic sectional view corresponding to a step of the manufacturing method shown in FIG. 25.

Exemplarily, as shown in FIG. 28, the second substrate 5 is cut in the direction perpendicular to the second substrate 5 to form multiple first substrates 1, and a cutting position is the junction of the second surface B and the at least one third surfaces C. Here, for example, the first substrate 1 of the display panel includes merely one third surface C. The second substrate 5 is cut at the positions of the dotted lines in FIG. 27 to form the multiple first substrates 1 shown in FIG. 28. The cut first substrate 1 has a first surface A (i.e., the upper surface of the first substrate 1), a second surface B perpendicular to the first surface A, and a third surface C connecting the first surface A and the second surface B.

In an embodiment, after the chamfering process is performed on the respective portion of the second substrate corresponding to each display panel to form the at least one third surface, the method for manufacturing a display panel may further include the following step: a fifth patterned structure is formed on the first surface and the third surface of the respective portion of the second substrate corresponding to each display panel, where the fifth patterned structure is composed of portions of the first signal lines on the first surface and the at least one third surface, second connection portions, and multiple second signal lines electrically connected to the multiple second connection portions respectively.

Exemplarily, in conjunction with FIGS. 10, 20 and 27, before the second substrate 5 is cut in the direction perpendicular to the second substrate 5 to form multiple first substrates 1, the chamfering process has been performed on the respective portion of the second substrate 5 corresponding to each display panel to form the third surface C of the first substrate 1, and a fifth patterned structure 64 may be formed on the first surface A and the third surface C of the respective portion of the second substrate 5 corresponding to each display panel, that is, the fifth patterned structure 64 is formed on the inclined surface of the chamfer and on the first surface A of the first substrate 1 connected to the inclined surface of the chamfer. The fifth patterned structure 64 is composed of portions, on the first surface and at least one third surface, of the first signal lines 31 connected to the first connection portions 21 on the second surface B, second signal lines 32, and the second connection portions 22 on the third surface C.

In step S51, a first patterned structure is formed on the second surface of the first substrate, where the first patterned structure at least includes first connection portions.

Exemplarily, in conjunction with FIGS. 10, 21 and 28, after the second substrate 5 is cut to form the first substrates 1, the second surface B of the first substrate 1 is exposed, and a first patterned structure 61 is formed on the second surface B of the first substrate 1, where the first patterned structure 61 at least includes first connection portions 21. The first patterned structure 61 may include merely the multiple first connection portions 21; at this time, multiple first signal lines 31 trace merely through the first surface A and at least one third surface C. Alternatively, the first patterned structure 61 may include not only the multiple first connection portions 21 but also the portions of the multiple first signal lines 31 located on the second surface B and electrically connected to the multiple first connection portions 21 respectively; at this time, the multiple first signal lines 31 trace through the first surface A and the at least one third surface C then trace into the second surface B, and the first patterned structure 61 is composed of the first connection portions 21 and the portions of the first signal lines 31 on the second surface B.

In conjunction with FIGS. 19 to 21 and FIGS. 27 and 28, during forming the first patterned structure 61 on the second surface B of the first substrate 1, a repair line may be formed on at least a portion of the third surface C of the first substrate 1, and the repair line is at least composed of a portion of the first signal lines 31 on the third surface C and a portion of the second connection portions 22. Exemplarily, before the second substrate 5 is cut to form the first substrates 1 and when the fifth patterned structure 64 is formed on the first surface A and the third surfaces C of the respective portion of the second substrate 5 corresponding to each display panel, it is possible that the complete pattern shown in FIG. 20 cannot be formed on the third surface C since the third surface is an inclined surface, resulting in an open circuit of the first signal line 31 electrically connected to the first connection portion 21 or an open circuit between the second connection portion 22 and the second signal line 32, and thereby affecting the normal display effect of the display panel.

After the second substrate 5 is cut to form the multiple first substrates 1, the second surface B of the first substrate 1 is exposed. In addition, the chamfer is disposed, that is, the third surface C is disposed, so that during manufacturing the first patterned structure 61 on the second surface B, the incomplete pattern on the third surface C may be repaired, so as to form the complete pattern on the third surface C as shown in FIG. 20. Therefore, the breakage probability of the first signal line 31 electrically connected to the first connection portion 21 or the breakage probability of the second signal line 32 electrically connected to the second connection portion 22 and is greatly reduced, and the impact of the breakage on the display effect of the display panel.

According to the method for manufacturing a display panel provided in the embodiment of the present application, the resolution of the display panel and the binding stability of the flexible circuit board and the display panel are improved; at the same time, the side binding technology is implemented to greatly reduce the width of the non-display region NAA of the display panel in the direction XX' from the display region AA towards the non-display region NAA, which is beneficial to the implementation of the narrow bezel of a hard screen. In addition, the first substrate 1 includes at least one third surface C to facilitate repairing of the signal line on the third surface C and repairing of the second connection portion 22 during manufacturing the first connection portions 21 on the second surface B. Therefore, the probability of an open circuit in the path from the connection portion to the corresponding signal line is reduced. Moreover, the third surface C is disposed so that the transition from the second surface B to the first surface A of the first substrate 1 is closer to an arc transition, reducing the probability of the signal line 3 being broken.

Figure 29:
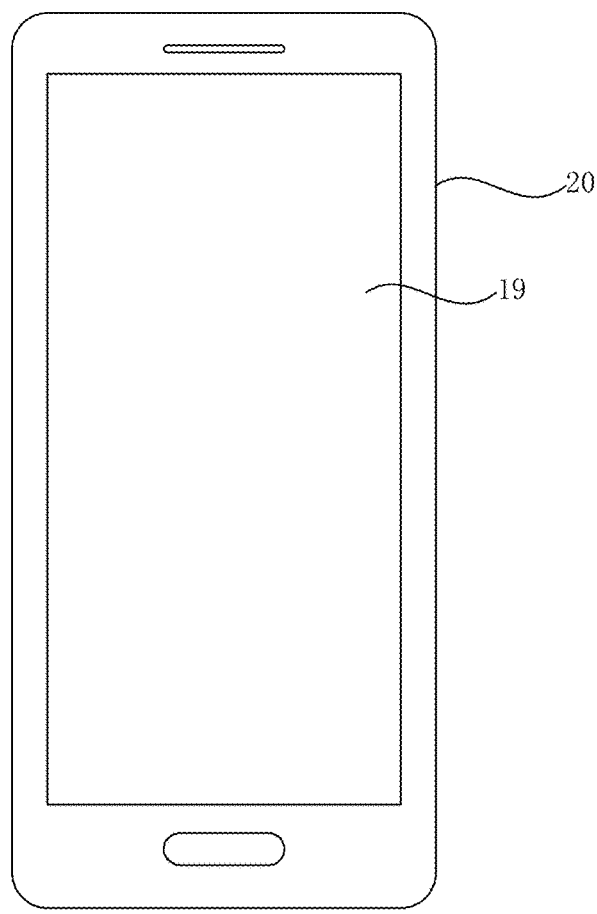
FIG. 29 is a schematic structure diagram of a display device according to an embodiment of the present application.

A display device is further provided in an embodiment of the present application. FIG. 29 is a schematic structure diagram of a display device according to an embodiment of the present application. As shown in FIG. 29, a display device 20 includes the display panel 19 described in the preceding embodiment. Exemplarily, the display device 20 may be an organic light-emitting display device or a liquid crystal display device, and the display device 20 may be a mobile phone or an electronic device such as a computer or a wearable device. The form of the display device is not limited in the embodiments of the present application.

What is claimed is:

1. A method for manufacturing a display panel, comprising:
providing a second substrate corresponding to a plurality of display panels;
processing a respective portion of the second substrate corresponding to each of the plurality of display panels to form at least one third surface;
cutting, at a junction of a second surface and the at least one third surface, the second substrate in a direction perpendicular to the second substrate to form a plurality of first substrates, wherein each first substrate comprises a first surface, the second surface is perpendicular to the first surface, and the at least one third surface connecting the first surface and the second surface;
forming a repair structure on at least part of the at least one third surface of each first substrate;
making a thickness of a first base of each first substrate on the second surface in a direction perpendicular to the first surface less than a thickness of the first base on the first surface in the direction perpendicular to the first surface; and
forming, on the second surface of each first substrate, a first patterned structure having a plurality of first connection portions electrically connected to a plurality of first signal lines to transmit display signals.

2. The method for manufacturing the display panel of claim 1, wherein the first patterned structure further comprises portions of the plurality of first signal lines located on the second surface and electrically connected to the plurality of first connection portions, respectively.

3. The method for manufacturing the display panel of claim 1, wherein processing the respective portion of the second substrate corresponding to each of the plurality of display panels to form the at least one third surface further comprises:
performing a chamfering process or a punching process on the respective portion of the second substrate corresponding to each of the plurality of display panels to form the at least one third surface.

4. The method for manufacturing the display panel of claim 3, wherein the at least one third surface comprises one third surface and performing the chamfering process or the punching process on the respective portion of the second substrate corresponding to each of the plurality of display panels to form the at least one third surface further comprises:
punching the second substrate to form a plurality of connection holes corresponding to the plurality of display panels, wherein each of the plurality of display panels comprises one connection hole exposing the one third surface and the plurality of first signal lines trace through connection holes.

5. The method for manufacturing the display panel of claim 4, before cutting the second substrate in the direction perpendicular to the second substrate to form the plurality of first substrates, the method further comprises:
forming a second patterned structure on the first surface of the respective portion of the second substrate corresponding to each of the plurality of display panels; and
forming a full-surface structure in each of the plurality of connection holes, and the second patterned structure comprises portions of the plurality of first signal lines located on the first surface.

6. The method for manufacturing the display panel of claim 5, wherein during forming the first patterned structure on the second surface of each first substrate, forming a third patterned structure on the one third surface of each first substrate, the third patterned structure comprises portions of the plurality of first signal lines located on the third surface;
wherein forming the third patterned structure on the third surface of each first substrate further comprises:
etching the repair structure on the third surface to form a repair line; and
etching the full-surface structure on the third surface to form a fourth patterned structure; wherein the third patterned structure comprises the repair line and the fourth patterned structure.

7. The method for manufacturing the display panel of claim 3, after performing the chamfering process on the respective portion of the second substrate corresponding to each of the plurality of display panels to form the at least one third surface, further comprising:
forming a fifth patterned structure on the first surface and the at least one third surface of the respective portion of the second substrate corresponding to each of the plurality of display panels; wherein the fifth patterned structure comprises portions of the plurality of first signal lines on the first surface and the at least one third surface.

* * * * *